(12) United States Patent
Waltari

(10) Patent No.: US 10,962,933 B1
(45) Date of Patent: Mar. 30, 2021

(54) MULTIBIT PER STAGE PIPELINED TIME-TO-DIGITAL CONVERTER (TDC)

(71) Applicant: IQ—Analog Corporation, San Diego, CA (US)

(72) Inventor: Mikko Waltari, Escondido, CA (US)

(73) Assignee: IQ—Analog Corp., San Diego, CA (US)

( * ) Notice: Subject to any disclaimer, the term of this patent is extended or adjusted under 35 U.S.C. 154(b) by 0 days.

(21) Appl. No.: 17/125,089

(22) Filed: Dec. 17, 2020

(51) Int. Cl.
   *G04F 10/00* (2006.01)
   *H03M 1/50* (2006.01)
   *H03M 1/12* (2006.01)

(52) U.S. Cl.
   CPC .......... *G04F 10/005* (2013.01); *H03M 1/502* (2013.01); *H03M 1/12* (2013.01)

(58) Field of Classification Search
   CPC ........ G04F 10/005; H03M 1/502; H03M 1/12
   See application file for complete search history.

(56) References Cited

U.S. PATENT DOCUMENTS 10,715,754 B2 * 7/2020 Moore ................. G01S 7/4863
10,763,876 B2 * 9/2020 Lin ....................... G04F 10/005
10,797,714 B2 * 10/2020 Kinyua ............... H03M 1/0607

* cited by examiner

*Primary Examiner* — Brian K Young
(74) *Attorney, Agent, or Firm* — Law Office of Gerald Maliszewski; Gerald Maliszewski

(57) ABSTRACT

A multi-symbol per stage pipelined time-to-digital converter (TDC) is presented. The TDC includes a quantizer and a residue generator. The quantizer has an input to accept an analog input first time-differential signal comprising a binary level first edge separated from a binary level second edge by a first duration of time. The first time-differential signal is capable as being represented by m time intervals. The quantizer has an output to supply a first digital code representing Ceil($\log_2(m)$) bit values responsive to (m−1) time interval measurements. The first digital code is a time-to-digital conversion. For example, if the first time-differential signal is capable of being represented as a p-bit binary coded digital word, the quantizer outputs a first digital code representing the Ceil($\log_2(m)$) most significant bit (MSB) values of the p-bit digital word.

30 Claims, 12 Drawing Sheets

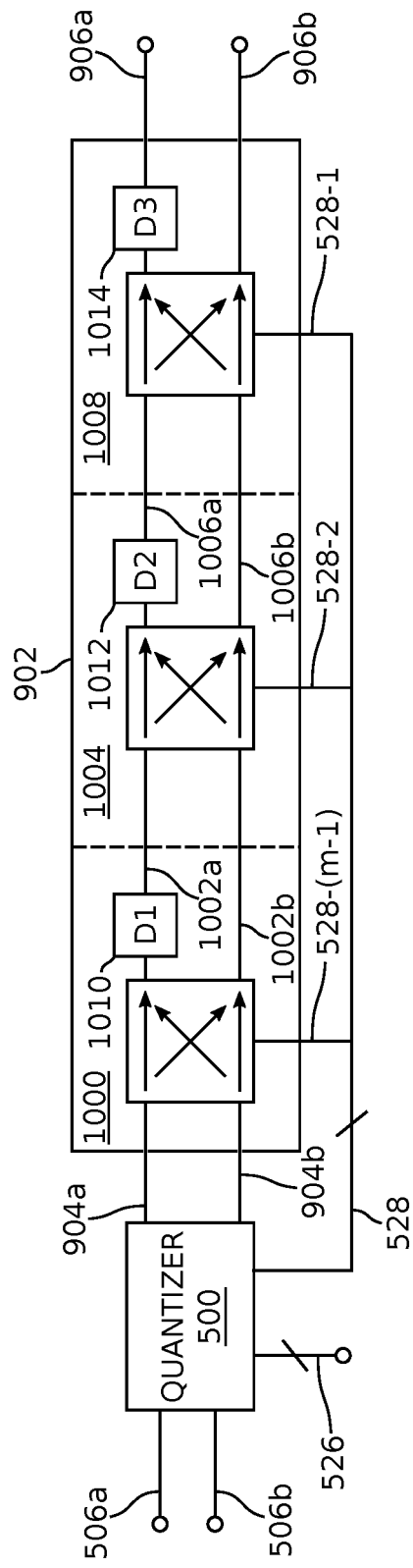
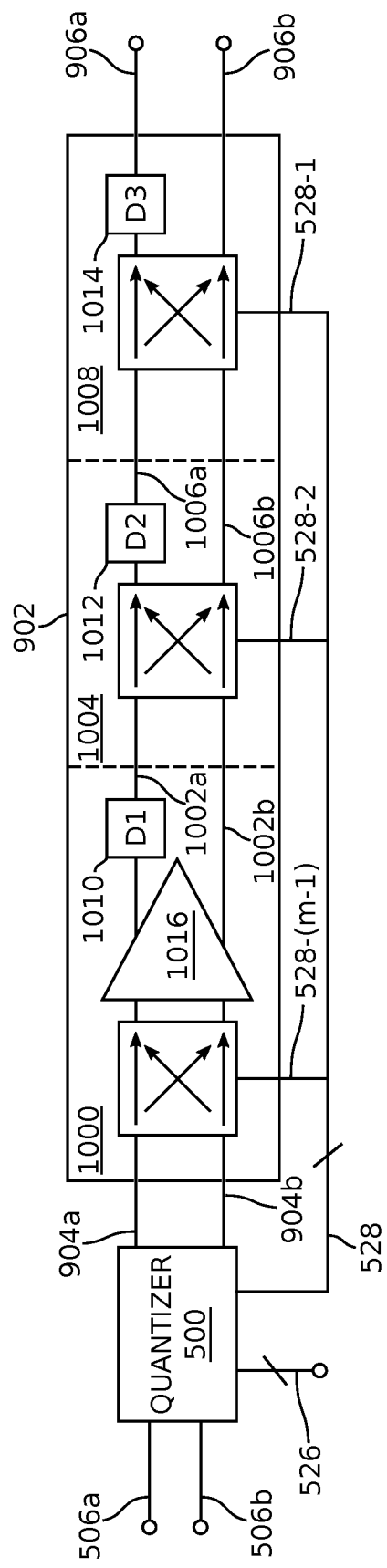
Fig. 10A
Fig. 10B

MULTIBIT PER STAGE PIPELINED TIME-TO-DIGITAL CONVERTER (TDC)

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to analog-to-digital conversion (ADC) and, more particularly, to time-to-digital conversion (TDC) systems and methods.

2. Description of the Related Art

FIG. 1 is a simplified schematic of an analog-to-digital converter (ADC) comprised of a voltage-to-time (V2T) converter and a time-to-digital converter (TDC) based upon a single slope principle (prior art). The A-to-D conversion process is split in two steps. In the first step the input voltage is converted into a time domain signal using pulse position or pulse width modulation. In the second step this signal is digitized using a TDC. The advantage of this method is that most of the complexity of the design is in the TDC part, which can be implemented in digital, or digital-like circuitry that enjoys all the benefits of technology scaling in the CMOS process.

The governing principle in many TDCs is to convert an analog time domain input signal to its digital equivalent in several steps or stages, each producing one bit of digital information, along with an analog residue (remainder) signal that is passed on to be further processed in a subsequent step. In the end, the bits from all the stages are combined to make a final digital output word. Usually the residue formation is the most critical operation in terms of required accuracy, resource usage, and operating speed.

One commonly used TDC architecture is the gated ring-oscillator. It uses start and stop signals to define the time interval to be digitized. The start signal is used to start the oscillator and the stop signal is used to capture the state of the oscillator, and so determine its state at a sub-period level. A digital counter is used to count the number of full oscillator cycles. The speed of the counter determines the minimum oscillation periods, and a large number of quantization levels is power and circuit area consuming. Another limitation of many conventional systems is that they are not truly time differential. While the measurement interval is defined to be the difference between the start and the stop signals, the start signal must always arrive before the stop signal. Thus, in a system using a pair of signals (two inputs), the start signal must always be carried on one predetermined line and the stop pulse always carried on the other line.

Another common technique used in ADCs and also adopted in TDCs is to perform a coarse, often only a single bit, conversion on the input signal, and then use its result to control the residue generation. While this easily yields a precise residue signal, the downside is that the residue generation cannot begin until the coarse conversion result is ready. In practice, this means that the input signal to the residue generator has to be delayed while the coarse conversion is in progress. This common mode delay obviously limits the operating speed. In analog-to-digital converters delaying the voltage domain signal is trivial: the signal can be stored as a charge in a capacitor. In time domain processing, however, delaying a signal means passing it through a chain of delay elements that add noise and consume power.

FIG. 2 is a schematic block diagram of a sort-and-delay residue generator stage (prior art). This circuitry is described in detail in U.S. Pat. No. 9,831,888, entitled Sort-and-Delay Time-to-Digital Converter, invented by Mikko Waltari, and is incorporated herein by reference. A single bit quantization of a time-differential input signal involves detecting which one of the two input time-differential signal components arrives first, or in other words, which signal component has a rising (falling) edge earlier in time. This can be accomplished with an arrival time comparator (ATC) or a set-reset latch. The operation is essentially a zero crossing detection. Unfortunately, as mentioned above, delays must be used to await the results of the quantization decision.

In this single-bit per stage sort-and-delay TDC, the operation carried out by a TDC stage consists of sorting the incoming edges in order of arrival and routing the first to arrive to a first output, and the last to arrive to a second output. The first output is further passed through a delay cell. These two signals, the delayed first output and the second output, form a residue signal that is passed on to the next stage.

FIG. 3 is a schematic block diagram depicting a series of three quantization/residue generator stages (prior art). Repeating the process described in FIG. 2 through several stages with decreasing delays has the effect of bringing the residue signal edges closer together. This is somewhat analogous to the operation of a pipelined or successive approximation ADC. The TDC stage also records the routing decision and outputs it as a digital bit. The digital output of the TDC can be calculated from the output bits of the stages using the knowledge of the magnitudes of the delays in each stage. In its simplest form, the TDC consists of stages with binary delays, with the delay in the first stage being D, in the second D/2, in the third D/4, and so forth. The digital output is simply calculated by performing a Gray-to-binary conversion to the digital word formed from the stage output bits. In practice, some form of trimming may be required to implement the exact delays with precisely binary weights.

It would be advantageous to have a TDC where common mode delay is reduced by using fewer pipeline stages, so that at least some of the stages produce more than one output bit.

SUMMARY OF THE INVENTION

Disclosed herein are systems and methods for quantizing multiple digital bits of a time-differential analog input signal, and then using the multiple quantized bits to control a residue generator.

Accordingly, a multi-symbol per stage pipelined time-to-digital converter (TDC) is presented. The TDC includes a quantizer and a residue generator. The quantizer has an input to accept an analog input first time-differential signal comprising a binary level first edge separated from a binary level second edge by a first duration of time. The first time-differential signal is capable as being represented by, or rendered into m time intervals. The quantizer has an output to supply a first digital code representing Ceil($\log_2(m)$) bit values responsive to (m−1) time interval measurements. The first digital code is a time-to-digital conversion. For example, if the first time-differential signal is capable of being represented as a p-bit binary coded digital word, the quantizer outputs a first digital code representing the Ceil($\log_2(m)$) most significant bit (MSB) values of the p-bit digital word. The quantizer also has an output to supply a second digital code residue control signal representing the Ceil($\log_2$(m)) bit values.

The residue generator has a signal input to accept a second time-differential signal, delayed from the input first time-differential signal, having a binary level first edge separated from a binary level second edge by the first duration of time. A control input accepts the residue control signal and a signal output supplies an output time-differential signal having a first edge separated from a second edge by a second duration of time, where the difference between the first and second durations of time is responsive to the Ceil($\log_2$(m)) bit values. In one aspect, to prevent worst case timing delays, the quantizer outputs a default residue control signal representing the minimum [Ceil($\log_2$(m))–1] bit values prior to accepting the input time-differential signal.

In one example, the quantizer includes a delay generator with a signal input to accept the first time-differential signal, with a first set of (m–x)/2 serially connected delay circuits having an input to accept the first edge and an output to supply first edge signals with (m–x)/2 delays, where x=2 when m is an even integer and x=1 when m is an odd integer. The delay generator has a second set of (m–x)/2 serially connected delay circuits having an input to accept the second edge and an output to supply second edge signals with (m–x)/2 delays. The quantizer includes a detector with a comparator network to make (m–1) number of time interval measurements between the first edge signals and the second edge signals. The detector has an output to supply prediction signals representing the time interval measurements from the comparator network. A logic circuit includes a calculator having an input to accept the prediction signals, and an output to supply the first and second digital codes.

In one aspect, the residue generator is made up of stages, so that a first residue generator stage has a signal input to accept the second time-differential signal and a control input to accept a first residue control signal bit. The first residue generator supplies a first output time differential signal with a leading edge, selected in response to the first residue control signal bit value, delayed a first time interval D1. More generally, an (m–1)th residue generator has a signal input to accept an (mth–2) output time-differential signal and a control input to accept an (m–1)th residue control signal bit. The (m–1)th residue generator supplies an (m–1)th output time differential signal with a leading edge, selected in response to the (m–1)th residue control signal bit value, delayed an (m–1)th interval of time D(m–1).

The first residue generator stage, as also representing the other stages, includes a first multiplexor (MUX) having a first signal input to accept a first edge of a third time-differential signal, and a second signal input to accept a second edge of the third time-differential signal, where the third time-differential signal is delayed with respect to the second time-differential signal, see FIG. 2. The first MUX has a control input to accept the first residue control signal bit, and a signal output to supply a leading edge of the first output time-differential signal selected in response to the first residue control signal bit value. A second MUX has a first signal input to accept the second edge of the third time-differential signal, a second signal input to accept the first edge of the third time-differential signal, the control input to accept the first residue control signal bit. The second MUX has a signal output to supply a trailing edge of the first output time-differential signal selected in response to the first residue control signal bit value. A delay element has an input connected to the output of the first multiplexor to accept the leading edge, and an output to supply to a leading edge delayed the first interval of time D1.

In one aspect, the first residue generator may further include a time amplifier having an input to accept the leading edge of the first output time-differential signal, prior to being delayed the duration of time D1, and an input to accept a trailing edge of the first output time-differential signal, separated from the leading edge by the first duration of time. The time amplifier has an output to supply a time-amplified leading edge, separated from the trailing edge by a time-amplified duration of time, directly proportion to the first duration of time. Then, the first residue generator delays the time-amplified edge by the first duration of time D1.

As an alternative, the residue generator may use a programmable delay network with a signal input to accept the second time-differential signal, and a delay signal output to supply (m–1) delay signals. A control network has a control input to accept the residue control signal and a signal output to supply the output time-differential signal. In one aspect, the programmable delay network includes a first set of (m–x)/2 delay circuits having an input to accept the first edge of the second time-differential signal, where x=2 when m is an even integer and x=1 when m is an odd integer. A second set of (m–x)/2 delay circuits has an input to accept the second edge of the second time-differential signal.

The first set of (m–x)/2 delay circuits are serially connected, as is the second set of (m–x)/2 delay circuits. The control network includes a first MUX having an input to accept the delay signals from the first set of delay circuits, and an input to accept the residue control signal. A second MUX has an input to accept the delay signals from the second set of delay circuits, and an input to accept the residue control signal. The first and second MUXs each have a signal output to supply differing edges of the output time-differential signal.

Alternatively, The residue generator includes (m–x)/2 stages. Each stage comprises a first set of delay circuits having an input to accept a first edge of a corresponding input time-differential signal and supply corresponding delay signals. A second set of delay circuits has an input to accept a second edge of a corresponding input time-differential signal and supply corresponding delay signals. A first MUX has an input to accept the corresponding delay signals from the first set of delay circuits, and an input to accept a corresponding residue control signal. A second MUX has an input to accept the corresponding delay signals from the second set of delay circuits, and an input to accept the corresponding residue control signal. Each stage has a signal output to supply a corresponding output time-differential signal with a leading edge separated from a trailing edge by a duration of time responsive to the corresponding residue control signal bit value. In yet another alternative, the control network includes a first MUX having a input to accept the second time-differential signal, an input to accept a first bit of the residue control signal, and an output to supply the leading edge and a trailing edge of the second time-differential signal, responsive the residue control signal first bit value. In this aspect the programmable delay network includes (m–x)/2 delay circuits having an input to accept the leading edge from the first MUX output, and an output to supply (m–x)/2 leading edge delay signals, where x=2. The control network further includes a second MUX having an input to accept the leading edge from the first MUX and leading edge delay signals, an input to accept [Ceil($\log_2$(m))–1] residue control signals bits, and an output to supply an output leading edge signal selected in response to the bit values of the residue control signal. The control network signal output supplies an output time-differential signal with the selected output leading edge separated from the trailing edge from the first MUX by the second duration of time.

Optionally, a time amplifier may be included having an input to accept the trailing edge from the first MUX and an input to accept the leading edge from the first MUX, prior to the programmable delay network. The time amplifier has output to supply a time-amplified leading edge, separated from the trailing edge by a time-amplified duration of time, directly proportion to the first duration of time.

Additional details of the above-described systems and associated method steps are provided below.

BRIEF DESCRIPTION OF THE DRAWINGS

FIGS. 10A and 10B are schematic block diagrams depicting the residue generator comprised of [(m−1)=3] sort-and-delay stages.

DETAILED DESCRIPTION

In the context of pipelined ADCs, multibit quantization can be straightforward. It is commonly implemented as a flash type sub-analog-to-digital converter (ADC) that simultaneously detects multiple quantization levels and produces a multibit output. A single bit quantization of a time-differential input signal involves detecting which one of the two input time-differential signal components arrives first, or in other words, which signal component has a rising (falling) edge earlier in time. This can be accomplished with an arrival time comparator (ATC) or a set-reset latch. The operation is essentially a zero crossing detection. This principle can be extended to perform a multi-bit quantization by first generating delayed versions of the positive and negative components of the time-differential input signal and then performing a zero crossing detection between different pairs of delayed signals. This process resembles a flash type sub-ADC with one crucial difference: in a time-domain quantizer the quantization results for different quantization levels become available at different times, which is not ideal. Furthermore, all the other bits, that are additional to a single bit quantization, take longer to resolve. This means that more wait time has to be added for the quantizer (common mode delay), which at least partially, defeats the purpose of performing multibit quantization in the first place.

Figure 4:
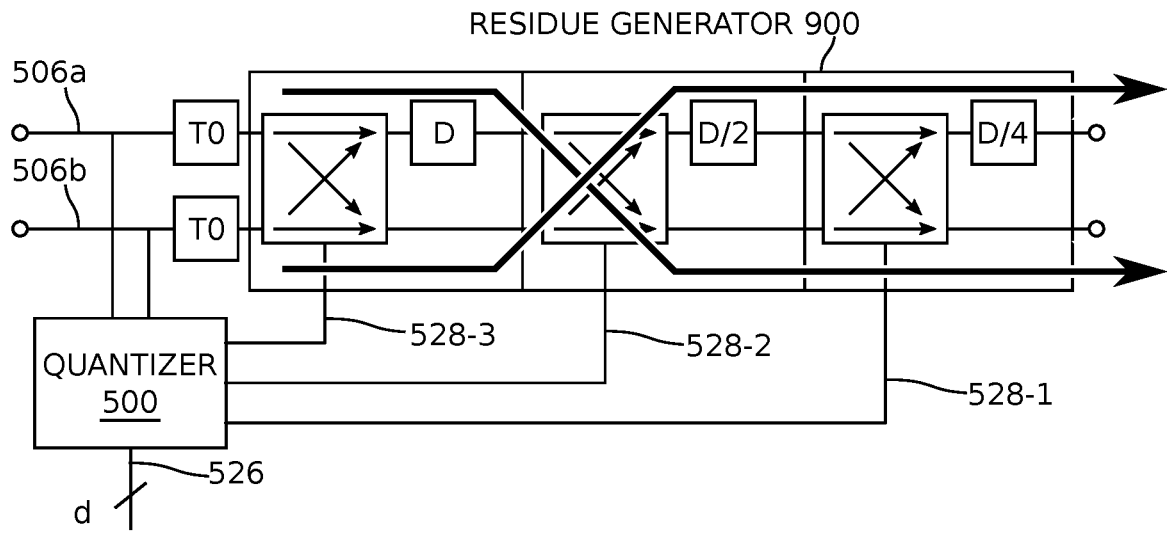
FIG. 4 is a schematic block diagram of a 3-bit quantizer and three stages of residue generators programmed with default control values.

FIG. 4 is a schematic block diagram of a 3-bit quantizer and three stages of residue generators programmed with default control values. One aspect of the system described herein is the use of properly selected default values for the residue generator to allow a delay in the least significant bit (LSB) control codes. This can be clarified with the following example. The worst case, timing wise, happens when the time differential input signal to the TDC stage is close to zero, i.e. the two edges arrive almost simultaneously. In the case of an ideal 3-bit stage residue generator, the residue generator has to delay one of the signals by the amount of the most significant bit (MSB) delay (e.g., delay D) and the other signal by the sum of the least significant bit (LSB) delays (e.g., sizes D/2 and D/4). As both of the edges arrive to the residue generator almost simultaneously, the residue generator has to be fully configured before they arrive.

Instead of having all the control codes fully determined however, this problem can be addressed using the determined control code for the MSB, but default control codes for the two LSBs. The default values are selected to produce the correct operation when the input signal is small (of short duration). When the input signal is larger by one quantization level, the correct configuration for the residue generator is to delay the first path by the amount of the MSB delay plus the lowest LSB delay (D+D/4), and the second path by the second lowest LSB delay (D/2). In this case, the signal that takes the second path through element size D/2 arrives later, which gives time to change the initial default configuration for delay element size D/4 and make it part of the first path. This additional time can be used in the quantizer without having to delay the signal to the residue generator. The quantizer is reset between every sample. The default configuration for the residue generator can be achieved by selecting a reset state that produces the desired configuration code.

Another way to understand the quantizer operation and the use of the default stage is to view the quantizer as an asynchronous circuit. Its output, the control code to the residue generator, asynchronously evolves to its final value starting from the default value. In the context of 3-bit sort-and-delay residue generator, the quantizer operation starts from initial reset state. At this point the quantizer has no information about the value of the input signal. It makes an initial guess that the input signal is small and programs the second and third switch accordingly. The state of the first switch is considered a "don't care". When the input signal reaches the quantizer, the MSB decision becomes available first. It determines whether the signal is positive or negative, and the first switch is programmed accordingly. The second and third switches stay at the default state. A short moment later the decision of the next quantization level becomes available. If the signal is smaller than the quantization level, the initial guess was correct and the decision is the same as the initial guess, which is kept as the final control code for the residue generator. If the signal is larger than the first quantization level, the guess is adjusted and the third switch polarity is reversed. The same process is repeated when the decision for the second quantization level becomes available. If the signal is smaller than the level, the adjusted guess was correct and the current control code is used as the final code. If not, the guess is adjusted again and the second switch polarity is reversed. This is also the final value for the second switch.

When the quantization result for the third and the final quantization level becomes available, the final decision for the third switch is made: either its current state becomes the final value or it is reversed for the second time.

If the switch control codes are described with binary codes, 0 indicating a crossed signal path and 1 indicating straight path, the residue generator control state can be described with a three bit word, where the MSB is the control bit for the first switch and the LSB for the third switch. The control state goes through the sequence 001, 000, 010, 011 in the case of a negative input signal (506b) and through the sequence 101, 100, 110, 111 in the case of positive input signal (506a). Depending on the magnitude (duration) of the input signal, the control state can go through the whole sequence or stop at any point, which then becomes the final control code and determines the value of the digital output value of the TDC stage.

Another aspect of this default process is sharing the delay elements between the quantizer and residue generator input. The residue generator common mode input delay is used to give the quantizer time to make its decision before the signal arrives to the residue generator. This delay can be realized by tapping off the signal from a proper location of the multibit quantizer delay generator (see FIG. 9A). Sharing the delay generator saves area and power.

Figure 1:
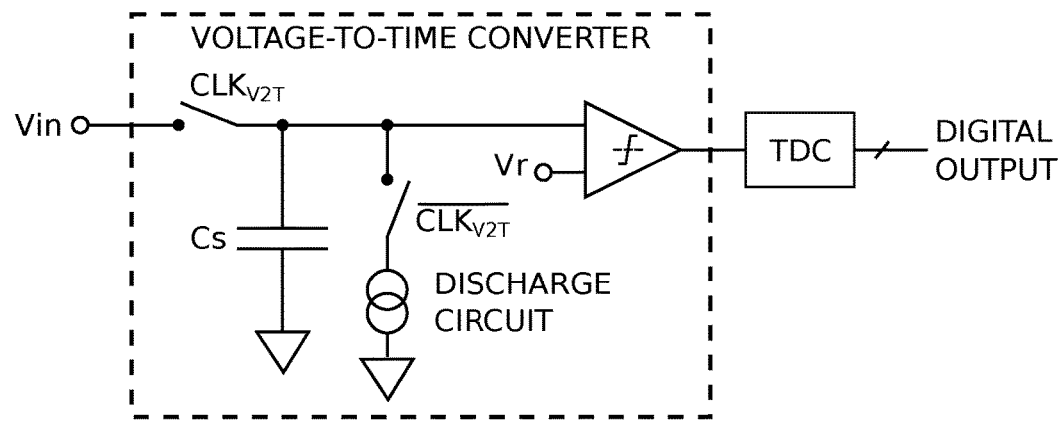
FIG. 1 is a simplified schematic of an ADC comprised of a voltage-to-time (V2T) converter and a time-to-digital converter (TDC) based upon a single slope principle (prior art).
Figure 2:
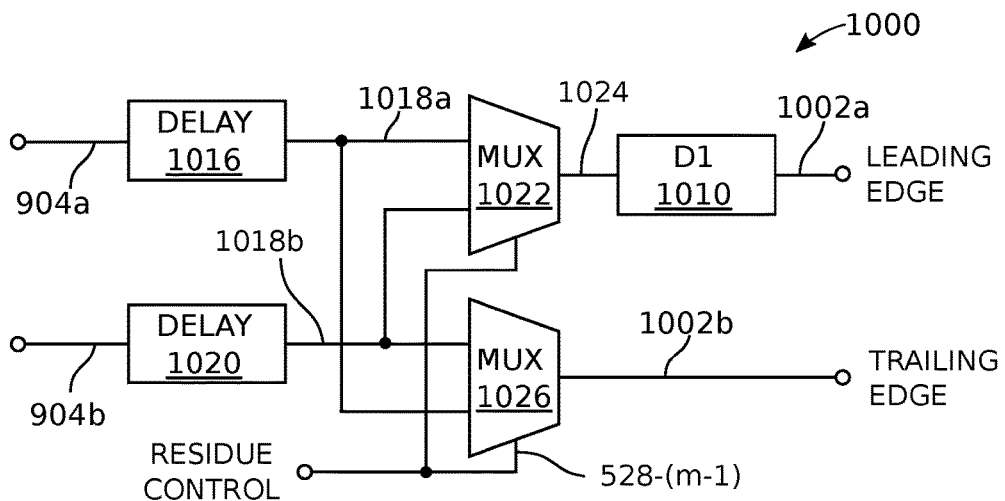
FIG. 2 is a schematic block diagram of a sort-and-delay residue generator stage (prior art).

In a single-bit per stage sort-and-delay TDC (FIG. 2), the operation carried out by a TDC stage consists of sorting the incoming edges in order of arrival and routing the first edge to arrive to a first output and the last edge to arrive to a second output. The first output is further passed through a delay cell. These two signals, the delayed first output and the second output, form a residue signal that is passed on to the next stage.

Figure 3:
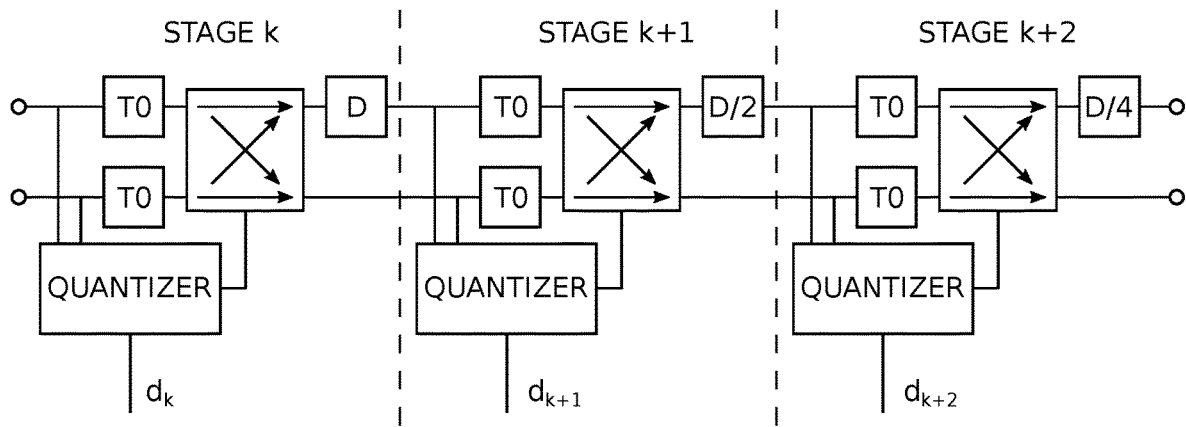
FIG. 3 is a schematic block diagram depicting a series of three quantization/residue generator stages (prior art).

Repeating this process through several stages (FIG. 3 or 4) with decreasing delays has the effect of bringing the residue signal edges closer together. This is somewhat analogous to the operation of a pipelined or successive approximation ADC. The TDC stage also records the routing decision and outputs it as a digital bit. The digital output of the TDC can be calculated from the output bits of the stages using the knowledge of the magnitudes of the delays in each stage.

In its simplest form the TDC consists of stages with binary delays, with the delay in the first stage being D, in the second D/2, in the third D/4, and so forth. The digital output is simply calculated by performing a Gray-to-binary conversion to the digital word formed from the stage output bits. In practice, some form of trimming may be required to implement the exact delays with precisely binary weights.

The TDC described herein may be a sort-and-delay TDC where the quantization of two or more single-bit stages are combined into one multibit quantizer located in the front, followed by a cascade of the residue generation blocks of those stages. This residue generator is comprised, for example, of routing switches and delay elements. As there is only one quantizer, the extra common mode delay that needs to be inserted in the signal path to implement a wait time for a quantizer operation is reduced significantly. The reduced delay improves the signal-to-noise ratio and reduces the power consumption.

The residue generator for a multibit stage can include time amplification (see FIGS. 10B, 11, and 16), which reduces the input referred noise contribution of the blocks that follow, and keeps the LSB size large enough to allow simple implementation of delay elements. The time amplifier can also be inserted in the front of the residue generator. In that case it has to be able to operate both on positive and negative signals. However, if it is inserted after the first routing multiplexer switch, before the MSB delay element, it only has to operate on positive signals, which simplifies the amplifier implementation. This is analogous to the situation in single-bit sort-and-delay TDC stage.

Figure 5:
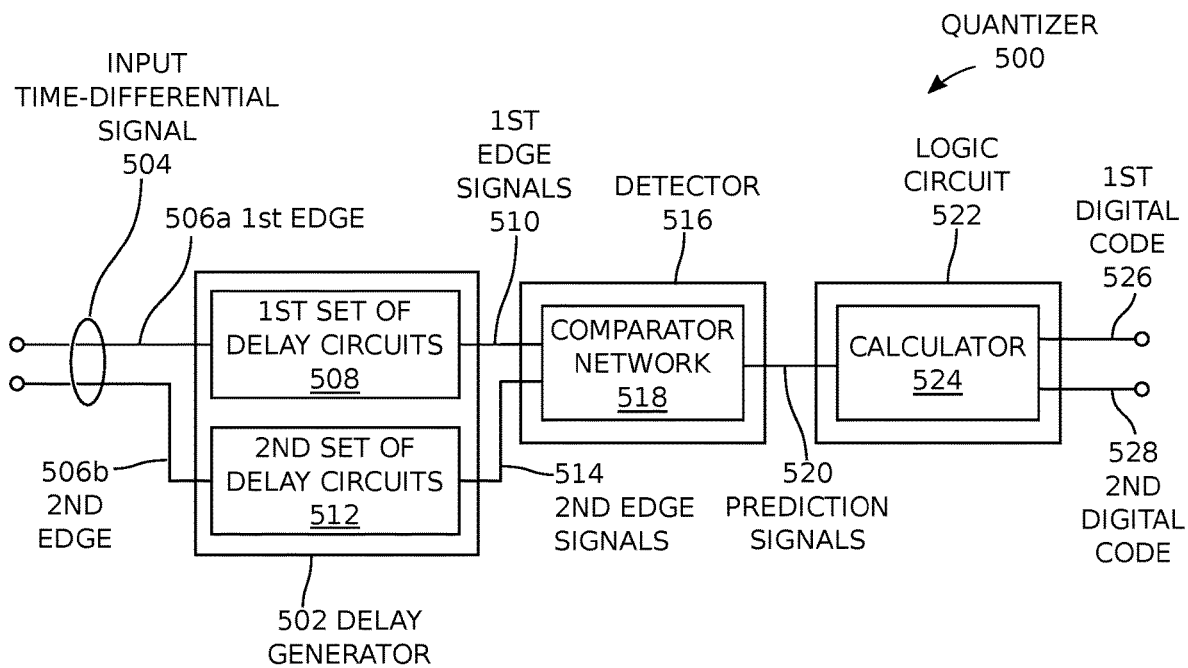
FIG. 5 is a schematic block diagram of a TDC multi-symbol quantizer.

FIG. 5 is a schematic block diagram of a TDC multi-symbol quantizer. The quantizer 500 comprises a delay generator 502 with a signal input 504 to accept an analog input time-differential signal comprising a binary level first edge 506a separated from a binary level second edge 506b by a duration of time, and capable of being represented as m time intervals. As used herein, a time-differential signal is understood to be a pair of bi-level signals, where one signal (pulse) indicates the start of a time durations to be measured and the other signal indicates the end (stop) of the time duration to be measured, but where there is no predetermined correlation between which signal is the start and which signal is the stop.

A first set of (m−x)/2 serially connected delay circuits 508 has an input to accept the first edge 506a and an output on line 510 to supply first edge signals with (m−x)/2 delays, where x=2 when m is an even integer and x=1 when m is an odd integer. A second set of (m−x)/2 serially connected delay circuits 512 has an input to accept the second edge 506b and an output on line 514 to supply second edge signals with (m−x)/2 delays.

A detector 516 comprises a comparator network 518 to accept the first edge signals on line 510 and second edge signals on line 514 and make (m−1) number of time interval measurements between the first edge signals and the second edge signals. The detector 516 has an output on line 520 to supply prediction signals representing the time interval measurements from the comparator network 518. A logic circuit 522 comprises a calculator 524 having an input on line 520 to accept the prediction signals and a digital output on line 526 to supply a first digital code representing Ceil($\log_2(m)$) bit values responsive to the time interval measurements. The bit values may also be referred to as digital symbol values. The logic circuit 522 has a digital output on line 528 to supply a second digital code residue control signal representing the Ceil($\log_2(m)$) bit values.

If the input time-differential signal is capable of being represented as a p-bit binary coded digital word, then the first digital code on line 526 represents the Ceil($\log_2(m)$) most significant bit (MSB) values of the p-bit binary coded digital word. Otherwise, the first digital code may be in the form of a thermometer code or a Gray code represented with the same number of digital symbols (bits). It should also be understood that the first and second digital codes are not necessarily in the same digital format. In one aspect as explained above, the logic circuit 522 may, prior to receiving the prediction signals on line 520, output a (default) second digital code equal to the minimum value of the [Ceil($\log_2$(m))−1] bits.

Figure 6:
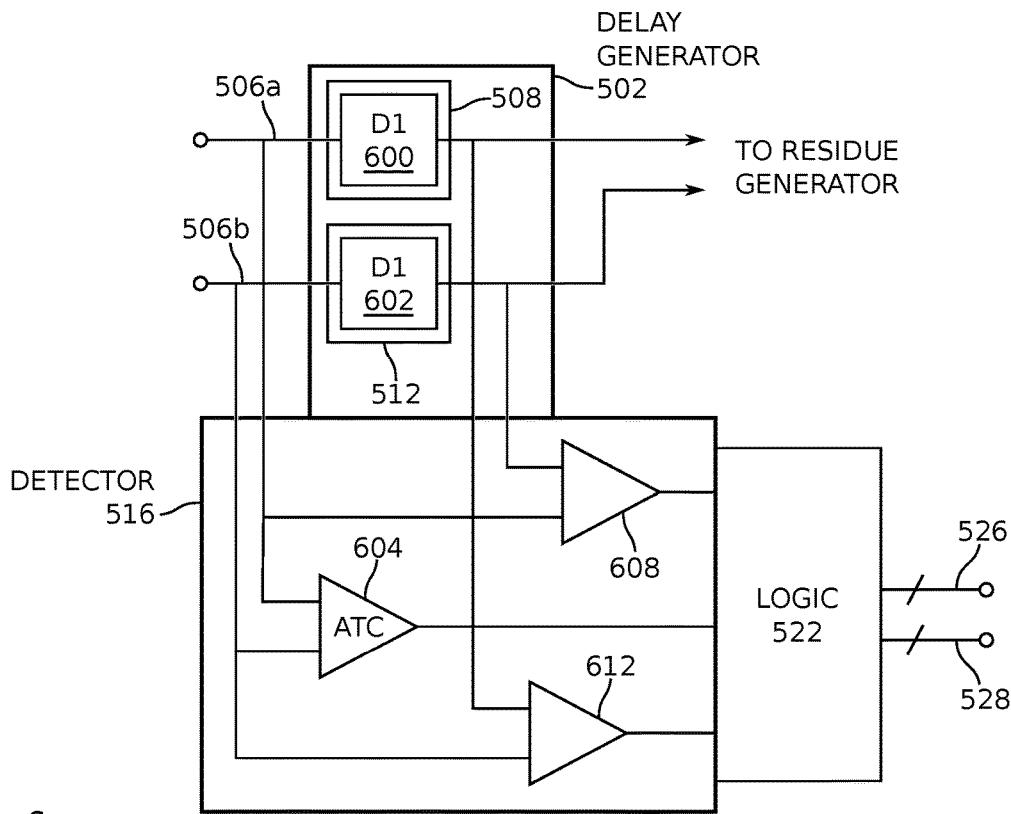
FIG. 6 is a schematic block diagram depicting a first variation of the quantizer.

FIG. 6 is a schematic block diagram depicting a first variation of the quantizer. In this example, m=4. The delay generator first set of delay circuits comprises a first delay element 600 having an input to accept the first edge 506*a* of the input time differential signal and an output to supply a first edge with a first delay D1 on line 510. The delay generator second set of delay circuits comprises a second delay element 602 having an input to accept the second edge of the input time differential signal 506*b* and an output to supply a second edge with the first delay D1 on line 514. The detector 516 comprises a first arrival time comparator (ATC) 604 having a first input to accept the first edge of the input time-differential signal 506*a*, a second input to accept the second edge of the input time-differential signal 506*b*, and an output on line 606 to supply a prediction signal responsive to the order in which the first and second edges are received. A second ATC 608 has a first input to accept the second edge with the first delay D1 on line 514, a second input to accept the first edge of the input time-differential signal 506*a*, and an output on line 610 to supply a prediction signal responsive to the order in which the first and second edges are received. A third ATC 612 has a first input to accept the first edge with the first delay D1 on line 510, a second input to accept the second edge of the input time-differential signal 506*b*, and an output on line 614 to supply a prediction signal responsive to the order in which the input signals are received. Typically, the first ATC 604, second ATC 608, and third ATC 612 are reset subsequent to the logic circuit supplying the first and second digital codes (before the next input time-differential signal is received).

Figure 7:
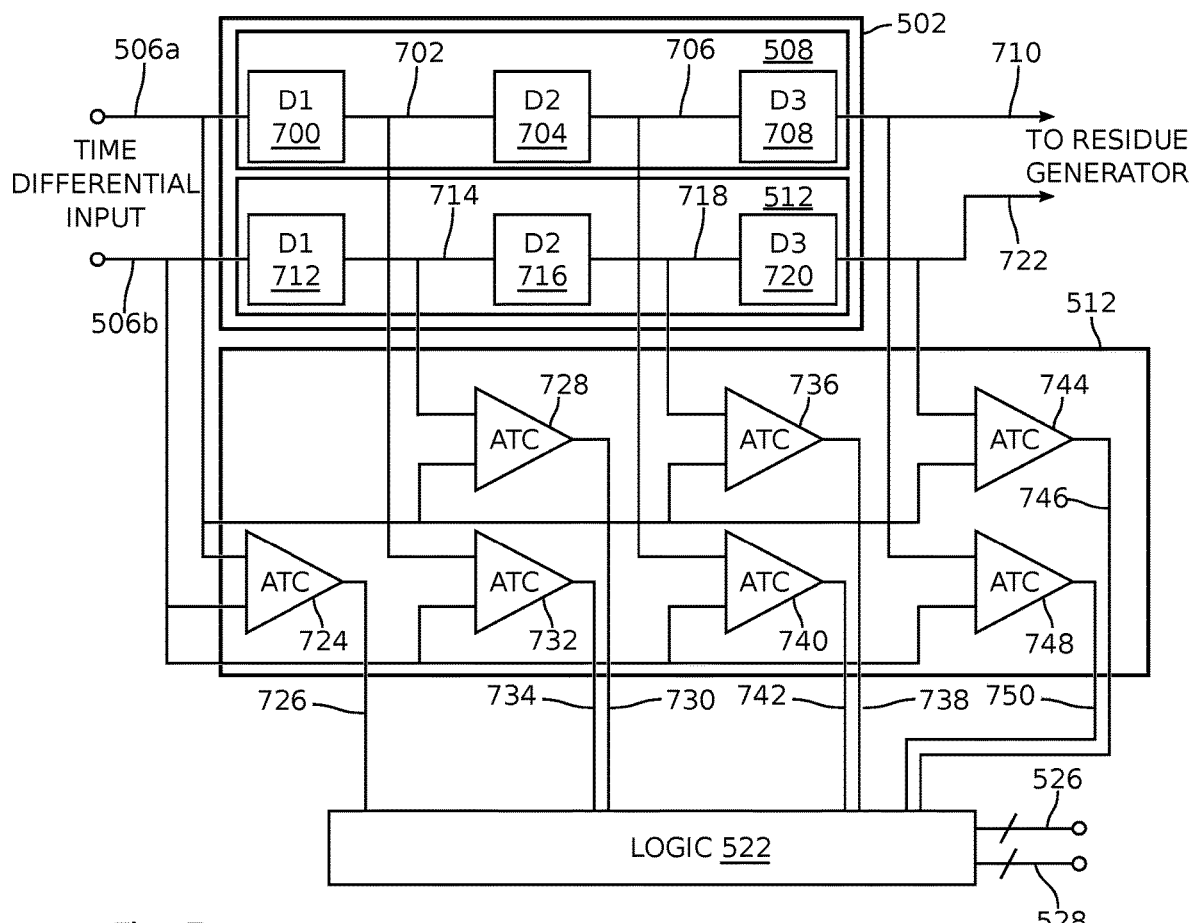
FIG. 7 is a schematic block diagram depicting a second variation of the quantizer.

FIG. 7 is a schematic block diagram depicting a second variation of the quantizer. In this example, m=8. With a similar arrangement of an odd number of comparators, m is always an even integer. The delay generator first set of delay circuits 508 comprises a first delay element 700 having an input to accept the first edge 506*a* of the input time differential signal and an output on line 702 to supply a first edge with the first delay D1. A second delay element 704 has an input on line 702 to accept the first edge with the first delay D1 and an output on line 706 to supply a first edge with a second delay D2. A third delay element 708 has an input on line 706 to accept the first edge with the second delay D2 and an output on line 710 to supply a first edge with a third delay D3. The delay generator second set of delay elements 512 comprises a fourth delay element 712 having an input to accept the second edge of the input time-differential signal 506*b* and an output on line 714 to supply a second edge with the first delay D1. A fifth delay element 716 has an input on line 714 to accept the second edge with the first delay D1 and an output on line 718 to supply a second edge with the second delay D2. A sixth delay element 720 has an input on line 718 to accept the second edge with the second delay D2 and an output on line 722 to supply a second edge with the third delay D3. To continue the example, the relationship between the delays may be as follows: D1=D2=D3. However, it should be understood that other relationships are possible.

The detector 512 comprises a first ATC 724 having a first input to accept the first edge of the input time-differential signal 506*a*, a second input to accept the second edge of the input time-differential signal 506*b*, and an output on line 726 to supply a prediction signal responsive to the order in which the input signals are received. A second ATC 728 has a first input on line 714 to accept the second edge with the first delay D1, a second input to accept the first edge of the input time-differential signal 506*a*, and an output on line 730 to supply a prediction signal responsive to the order in which the input signals are received. A third ATC 732 has a first input on line 702 to accept the first edge with the first delay D1, a second input to accept the second edge of the input time-differential signal 506*b*, and an output on line 734 to supply a prediction signal responsive to the order in which the input signals are received. A fourth ATC 736 has a first input on line 718 to accept the second edge with the second delay D2, a second input to accept the first edge of the time-differential signal 506*a*, and an output on line 738 to supply a prediction signal responsive to the order in which the input signals are received.

A fifth ATC 740 has a first input to accept the first edge with the second delay D2 on line 706, a second input to accept the second edge of the input time-differential signal 506*b*, and an output on line 742 to supply a prediction signal responsive to the order in which the input signals are received. A sixth ATC 744 has a first input on line 722 to accept the second edge with the third delay D3, a second input to accept the first edge of the input time-differential signal 506*a*, and an output on line 746 to supply a prediction signal responsive to the order in which the input signals are received. A seventh ATC 748 has a first input on line 710 to accept the first edge with the third delay D3, a second input to accept the second edge of the input time-differential signal 506*b*, and an output on line 750 to supply a prediction signal responsive to the order in which the input signals are received. As above, the ATCs are typically reset before the next input time-differential input signal is received.

For example, assuming that D1=D2=D3=1/2, the threshold are −3/2, −1, −1/2, 0, +1/2, +1, and +3/2. The interval center points are: −7/4, −5/4, −3/4, −1/4, +1/4, +3/4, +5/4, and −7/4.

Figure 8:
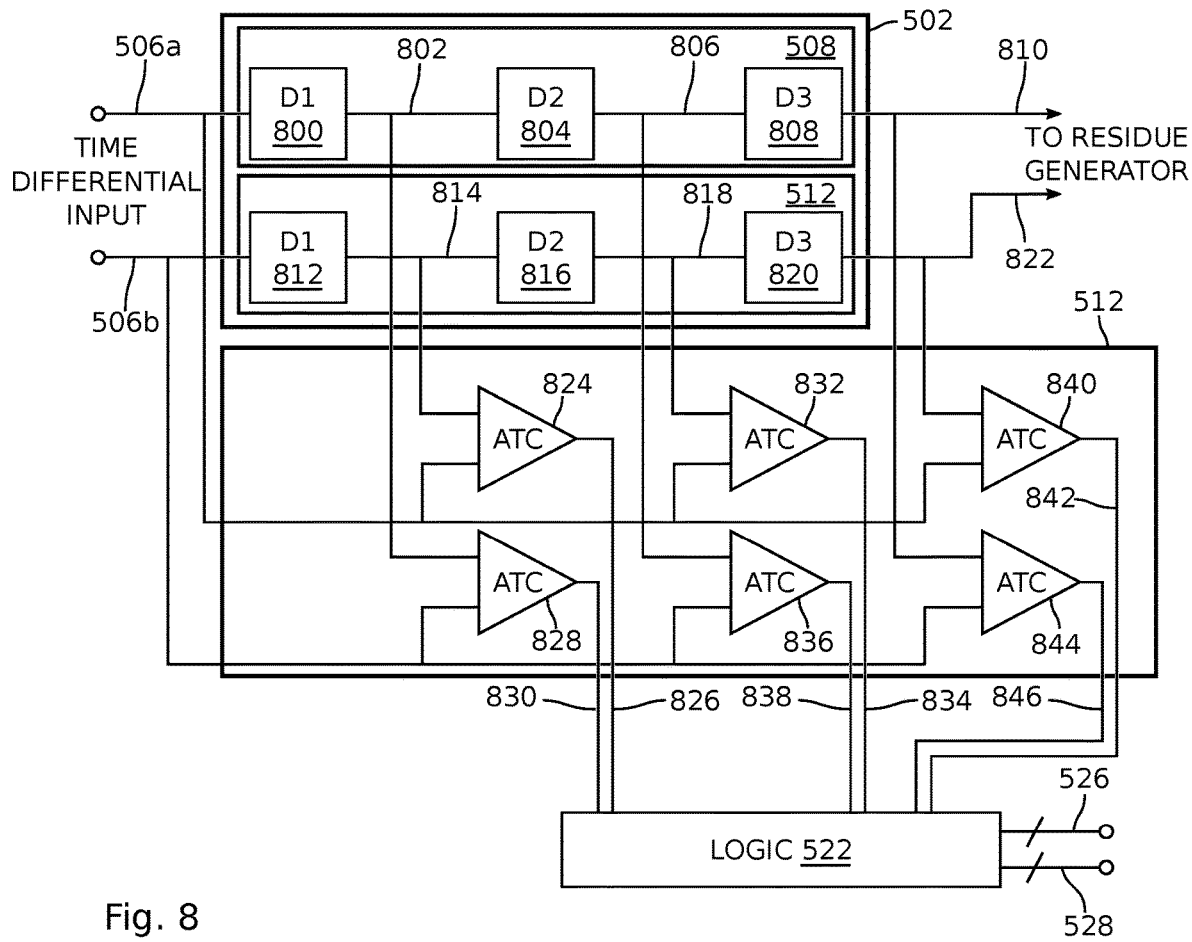
FIG. 8 is a schematic block diagram depicting a third variation of the quantizer.

FIG. 8 is a schematic block diagram depicting a third variation of the quantizer. In this example, m=7. With a similar arrangement of an even number of comparators, m is always an odd integer. The delay generator first set of delay circuits 508 comprises a first delay element 800 having an input to accept the first edge 506*a* of the input time differential signal and an output on line 802 to supply a first edge with the first delay D1. A second delay element 804 has an input on line 802 to accept the first edge with the first delay D1 and an output on line 806 to supply a first edge with a second delay D2. A third delay element 808 has an input on line 806 to accept the first edge with the second delay D2 and an output on line 810 to supply a first edge with a third delay D3. The delay generator second set of delay elements 512 comprises a fourth delay element 812 having an input to accept the second edge of the input time-differential signal 506*b* and an output on line 814 to supply a second edge with the first delay D1. A fifth delay element 816 has an input on line 814 to accept the second edge with the first delay D1 and an output on line 818 to supply a second edge with the second delay D2. A sixth delay element 820 has an input on line 818 to accept the second edge with the second delay D2 and an output on line 822 to supply a second edge with the third delay D3. To continue the example, the relationship between the delays may be as follows: 2D1=D2 and 2D1=D3. However, it should be understood that other relationships are possible.

The detector 512 comprises a first ATC 824 having a first input to accept the first edge of the input time-differential signal 506a, a second input on line 814 to accept the second edge with the first time delay D1, and an output on line 826 to supply a prediction signal responsive to the order in which the input signals are received. A second ATC 828 has a first input on line 802 to accept the first edge with the first delay D1, a second input to accept the second edge of the input time-differential signal 506b, and an output on line 730 to supply a prediction signal responsive to the order in which the input signals are received. A third ATC 832 has a first input on line 818 to accept the second edge with the second delay D2, a second input to accept the first edge of the input time-differential signal 506a, and an output on line 834 to supply a prediction signal responsive to the order in which the input signals are received. A fourth ATC 836 has a first input on line 806 to accept the first edge with the second delay D2, a second input to accept the second edge of the time-differential signal 506b, and an output on line 838 to supply a prediction signal responsive to the order in which the input signals are received.

A fifth ATC 840 has a first input to accept the second edge with the third delay D3 on line 822, a second input to accept the first edge of the input time-differential signal 506a, and an output on line 842 to supply a prediction signal responsive to the order in which the input signals are received. A sixth ATC 844 has a first input on line 810 to accept the first edge with the third delay D3, a second input to accept the second edge of the input time-differential signal 506b, and an output on line 846 to supply a prediction signal responsive to the order in which the input signals are received. As above, the ATCs are typically reset before the next input time-differential input signal is received.

Assuming that D1=1/4 and D2 and D3=1/2, the comparator thresholds are: −5/4, −3/4, −1/4, +1/4, +3/4, and +5/4. The comparator thresholds can also be defined by the mid points: −1.5, −1.0, −0.5, 0.0, +0.5, +1.0, +1.5.

Figure 9A:
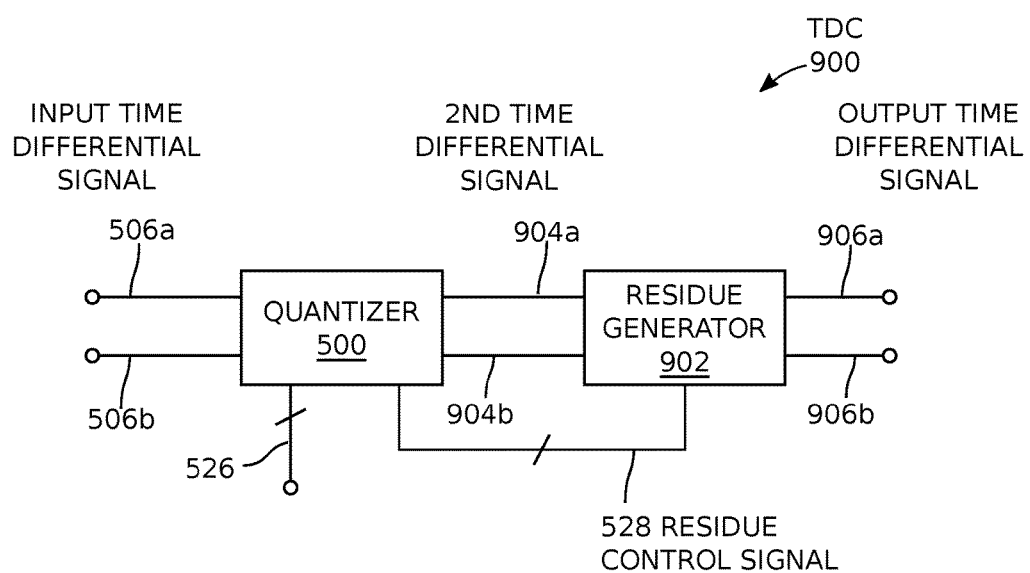
FIGS. 9A and 9B are schematic block diagrams of a multi-symbol per stage pipelined TDC.
Figure 9B:
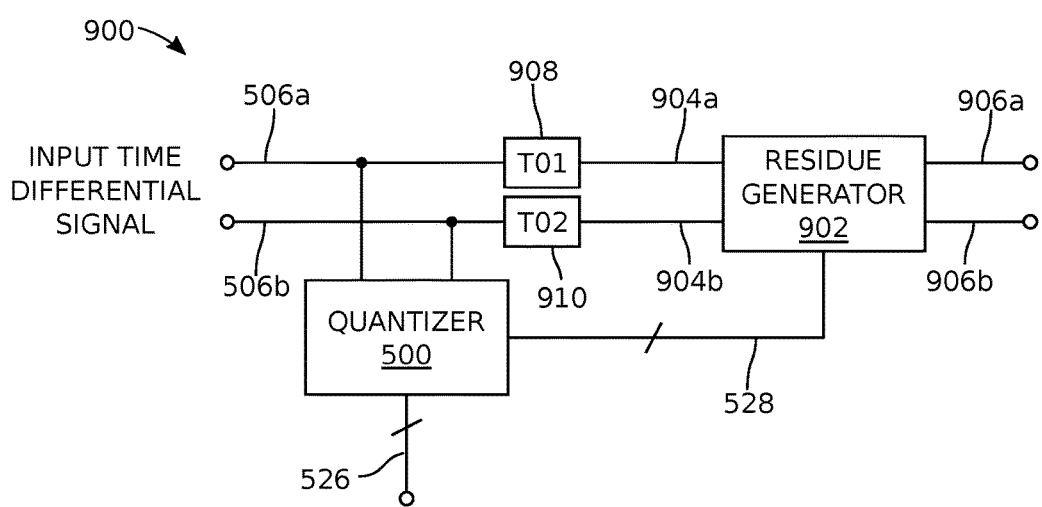

FIGS. 9A and 9B are schematic block diagrams of a multi-symbol per stage pipelined TDC. The TDC 900 comprises a quantizer 500 having an input to accept an analog input first time-differential signal comprising a binary level first edge 506a separated from a binary level second edge 506b by a first duration of time, and capable as being represented by m time intervals. The quantizer 500 has an output to supply a first digital code on line 526 representing Ceil(log$_2$(m)) bit values responsive to (m−1) time interval measurements, and an output on line 528 to supply a second digital code residue control signal representing the Ceil(log$_2$(m)) bit values. A residue generator 902 has a signal input to accept a second time-differential signal, from the quantizer (FIG. 9A), comprising a binary level first edge 904a separated from a binary level second edge 904b by the first duration of time. A control input accepts the residue control signal on line 528, and a signal output supplies an output time-differential signal having a first edge 906a separated from a second edge 906b by a second duration of time, where the difference between the first and second durations of time is responsive to the Ceil(log$_2$(m)) bit values.

As depicted in FIG. 4, the quantizer 500, prior to accepting the first time-differential signal, may output a default residue control signal representing the minimum [Ceil(log$_2$(m1))−1] bit values. If the first time-differential signal is capable of being represented as a p-bit binary coded digital word, the quantizer 500 may output a first digital code representing the Ceil(log$_2$(m)) most significant bit (MSB) values of the p-bit digital word. Otherwise, the first and second digital codes are supplied in a different format with the name number of digital symbols.

Optionally, as shown in FIG. 9B, the input time-differential signal path to the residue generator need not pass through the quantizer delay generator. However, to gain more time for the calculation of the residue control signal, the TDC 900 may further comprise a first delay (T01) 908 element having an output to supply the first edge of the second delayed time-differential signal on line 904a. A second delay element (T02) 910 has an output to supply the second edge of the second delayed time-differential signal on line 904b. The second time-differential signal may be considered as the first time-differential signal with common mode delay. Although not shown, the TDC of FIG. 9A may also incorporate the first and second delays elements T01 and T02.

It should be understood that the delays created in the quantizer delay generator and the delays produced by the residue generator do not have to accurately match, as the residue delays may be designed to be slightly different (e.g., smaller) to be able to tolerate more error in the measurements.

FIGS. 10A and 10B are schematic block diagrams depicting the residue generator comprised of [(m−1)=3] sort-and-delay stages. Any of the quantizers described above capable of making 3 time interval measurements is suitable for use with this residue generator. Although the quantizer of FIG. 9A is shown, the system can also be implemented with the quantizer described in FIG. 9B. A first residue generator stage 1000 has a signal input to accept the second time-differential signal on lines 904a and 904b. A control input on line 528-(m−1) accepts a first residue control signal bit, which is the largest symbol value (e.g., MSB). A signal output supplies a first output time differential signal with a leading edge on line 1002a, selected in response to the first residue control signal bit value, delayed a first time interval D1 by delay element 1010. The residue generator stages are depicted as sort-and-delay circuits as an example, but the system is not necessarily limited to this type of stages. A second residue generator stage 1004 has a signal input to accept the first output time-differential signal 1002a and 1002b. A control input on line 528-2 accepts a second residue control signal bit, and a signal output supplies a second output time differential signal with a leading edge 1006a, selected in response to the second residue control signal bit value, delayed a second interval of time D2 by delay element 1012. An (m−1)th residue generator stage 1008 has a signal input to accept an (mth−2) output time-differential signal on lines 1006a and 1006b. A control input on line 528-1 accepts an (m−1)th residue control signal bit (for example, the LSB), and a signal output supplies an (m−1)th output time differential signal with a leading edge on line 906a, selected in response to the (m−1)th residue control signal bit value, delayed an (m−1)th interval of time D(m−1) by delay element 1014.

Referring back to FIG. 2, the exemplary first residue generator stage of FIG. 10A can be seen in greater detail The residue generator stage 1000 includes a first delay element 1016 to accept the first edge of the second time-differential signal on line 904a and output the first edge of a third time-differential signal on line 1018a. A second delay element 1020 accepts the second edge to the second time-differential signal on line 904b and supplies a second edge of the third time-differential signal on line 1018b. A first multiplexor (MUX) 1022 has a first signal input to accept the first edge of the third time-differential signal on line 1018a, a second signal input on line 1018b to accept the second edge of the third time-differential signal. The first MUX 1022 has the control input on line 528-($m$–1) to accept the first residue control signal bit, and a signal output to supply a leading edge of the first output time-differential signal on line 1024 selected in response to the first residue control signal bit value. A second MUX 1026 has a first signal input to accept the second edge of the third time-differential signal on line 1018*b*, a second signal input to accept the first edge of the third time-differential signal on line 1018*a*, a control input on line 528-($m$–1) to accept the first residue control signal bit, and a signal output to supply a trailing edge of the first output time-differential signal on line 1002*b* selected in response to the first residue control signal bit value. The delay element 1010 has an input connected to the output of the first multiplexor to accept the leading edge on line 1024, and an output on line 1002*a* to supply to a leading edge delayed the first interval of time D 1. The other stages of the residue generator are similarly constructed, although the durations of the delay elements following the MUXs may vary.

FIG. 10B depicts the residue generator of FIG. 10A with the addition of a time amplifier 1016. The operation of the time amplifier is described in the explanation of FIG. 11, below.

Figure 11:
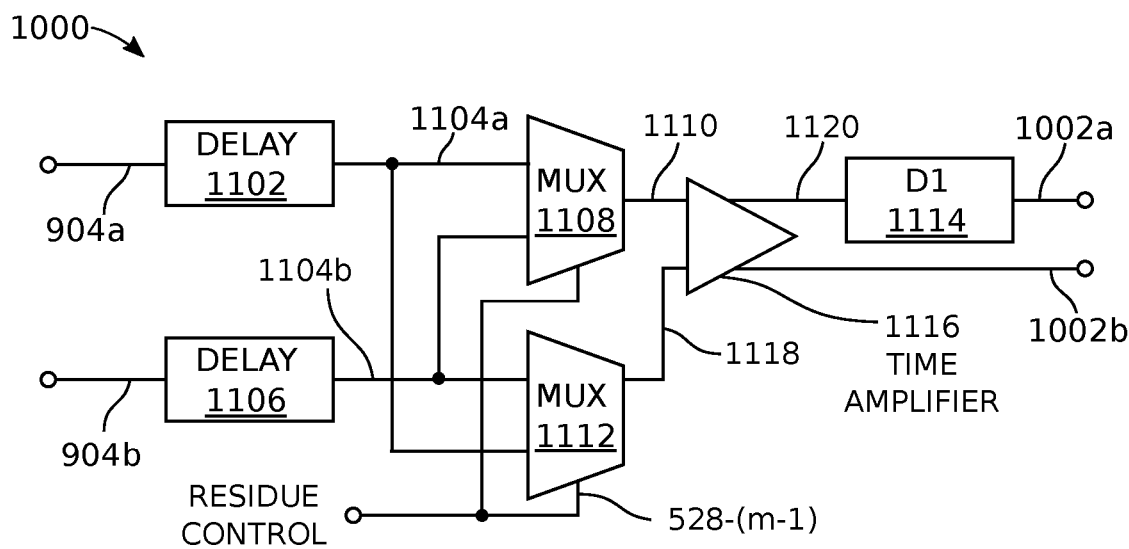
FIG. 11 is the schematic block diagram of the first residue generator stage of FIG. 10B in greater detail.

FIG. 11 is the schematic block diagram of the first residue generator stage of FIG. 10B in greater detail. The first residue generator stage 1000 further comprises a time amplifier 1116 having an input on line 1110 to accept the leading edge of the first output time-differential signal, prior to being delayed the duration of time D1. The time amplifier 1116 has an input on line 1118 to accept a trailing edge of the first output time-differential signal, separated from the leading edge by the first duration of time, and an output on line 1120 to supply a time-amplified leading edge, separated from the trailing edge on line 1118 by a time-amplified duration of time, directly proportion to the first duration of time. Subsequent to the delay element 1114, the first residue generator stage delays the time-amplified leading edge by the first duration of time D1.

Figure 12:
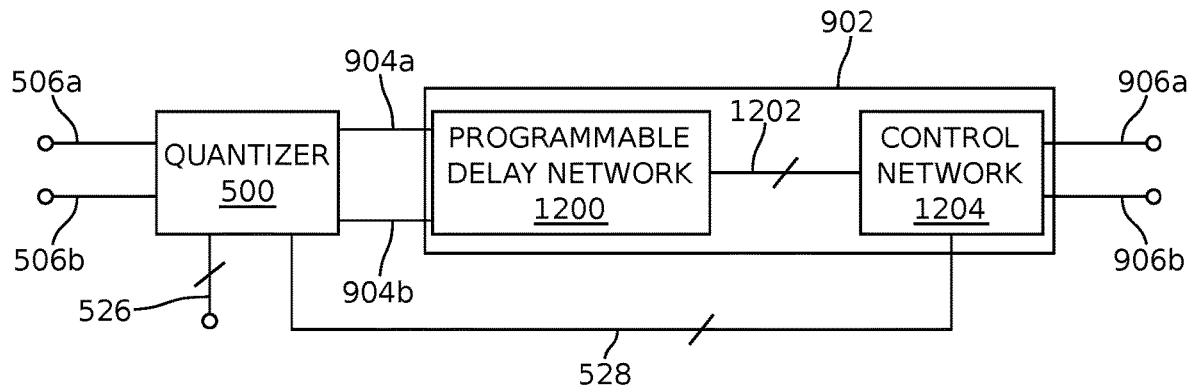
FIG. 12 is a schematic block diagram of residue generator using programmable delays.

FIG. 12 is a schematic block diagram of residue generator using programmable delays. The residue generator can be used with any of quantizers depicted in FIGS. 5-8, depending on whether m is an even or odd integer. Although the quantizer of FIG. 9A is shown, the system can also be implemented with the quantizer described in FIG. 9B. The residue generator 902 comprises a programmable delay network 1200 with a signal input to accept the second time-differential signal on lines 904*a* and 904*b*, and a delay signal output on line 1202 to supply (m–1) delay signals. A control network 1204 has a control input to accept the residue control signal on line 528, and a signal output to supply the output time-differential signal on lines 906*a* and 906*b*.

Figure 13:
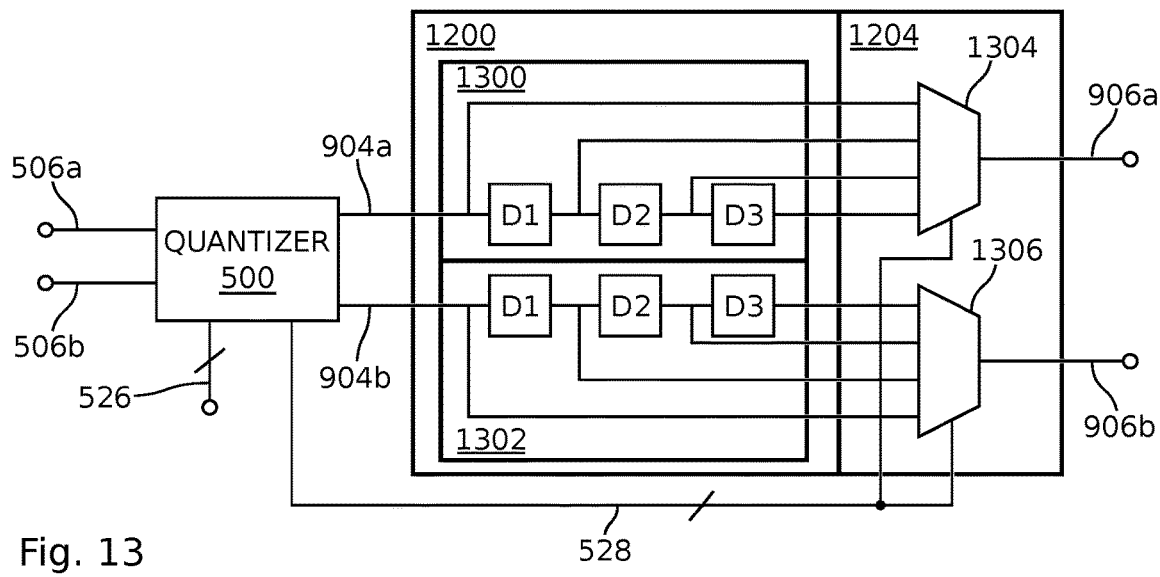
FIG. 13 is a schematic block diagram showing details of a first variation of the residue generator generally depicted in FIG. 12.

FIG. 13 is a schematic block diagram showing details of a first variation of the residue generator generally depicted in FIG. 12. In this example m may equal 7 if all the delays are nominally the same size and the first MUX (non-delayed) input is not used. Alternatively, m may be equal to 8 if D1 is half the duration of D2 and D3, and all the MUX inputs are used. Thus, any of the quantizers described above capable of making 7 or 8 time interval measurements is suitable for use with this residue generator. Although the quantizer of FIG. 9A is shown, the system can also be implemented with the quantizer described in FIG. 9B. The programmable delay network 1200 comprises a first set of (m–x)/2 delay circuits 1300 having an input to accept the first edge of the second time-differential signal on line 904*a*, where x=2 when m is an even integer and x=1 when m is an odd integer. A second set of (m–x)/2 delay circuits 1302 has an input to accept the second edge of the second time-differential signal on line 904*b*. The first set of (m–x)/2 delay circuits 1300 are typically serially connected, and the second set of (m–x)/2 delay circuits 1302 are typically serial connected, although the delays may, alternatively, be arranged in parallel.

The control network 1204 comprises a first MUX 1304 having an input to accept the delay signals from the first set of delay circuits 1300, and an input to accept the residue control signal on line 528. A second MUX 1306 has an input to accept the delay signals from the second set of delay circuits 1302, and an input to accept the residue control signal on line 528. The first MUX 1304 and the second MUX 1306 each have a signal output to supply differing (i.e., leading and trailing) edges of the output time-differential signal.

Figure 14:
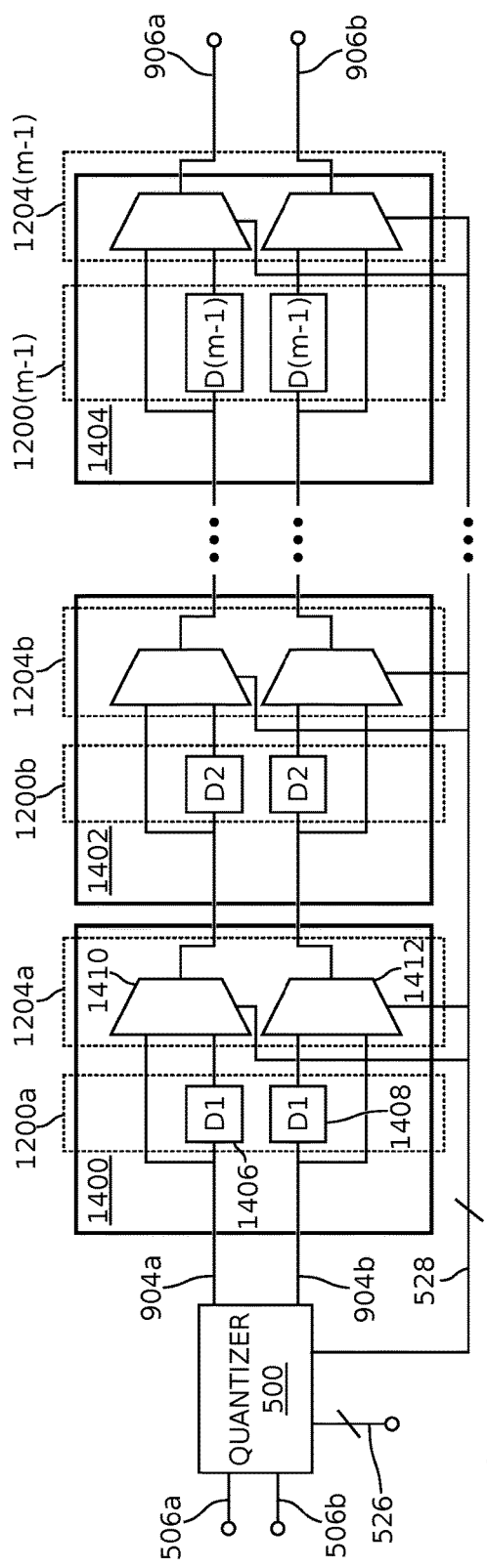
FIG. 14 is a schematic block diagram showing details of a second variation of the residue generator generally depicted in FIG. 12.

FIG. 14 is a schematic block diagram showing details of a second variation of the residue generator generally depicted in FIG. 12. In this example m=8. The residue generator 900 comprises (m–x)/2 stages, labeled 1400, 1402, and 1404. Using stage 1400 as an example, each stage comprises a programmable delay network 1200*a* with a first set of delay circuits 1406 having an input to accept a first edge of a corresponding input time-differential signal and supply corresponding delay signals. A second set of delay circuits 1408 has an input to accept a second edge of a corresponding input time-differential signal and supply corresponding delay signals. A control network 1204*a* includes a first MUX 1410 has an input to accept the corresponding delay signals from the first set of delay circuits, and an input to accept a corresponding residue control signal on line 528. A second MUX 1412 has an input to accept the corresponding delay signals from the second set of delay circuits, and an input to accept the corresponding residue control signal on line 528. The stage has a signal output to supply a corresponding output time-differential signal with a leading edge separated from a trailing edge by a duration of time responsive to the corresponding residue control signal bit value.

Figure 15:
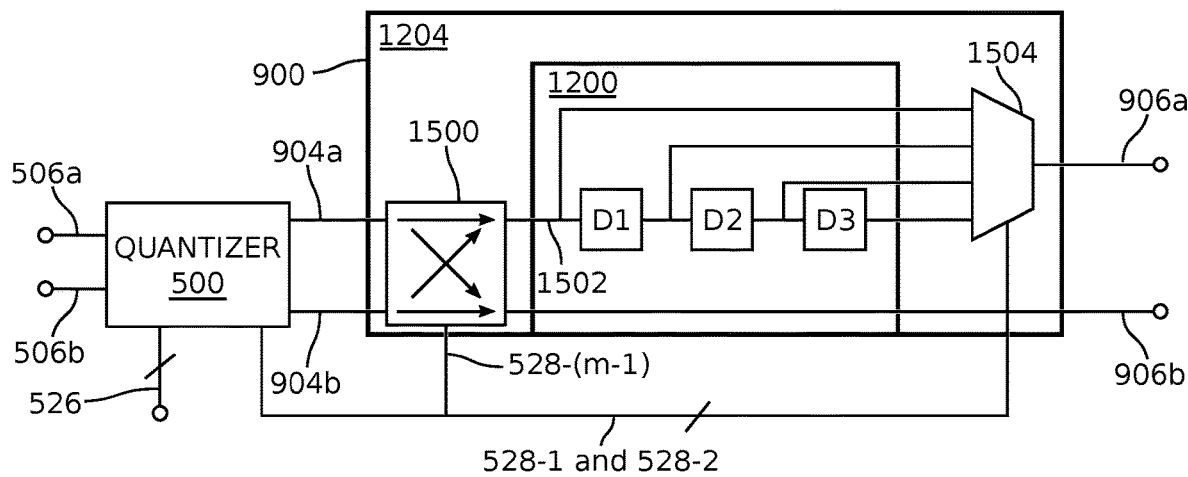
FIG. 15 is a schematic block diagram showing details of a third variation of the residue generator generally depicted in FIG. 12.

FIG. 15 is a schematic block diagram showing details of a third variation of the residue generator generally depicted in FIG. 12. In this example m=8, as the first MUX 1500 controls the polarity of the downstream signal and so doubles the number of levels. The control network 1204 comprises the first MUX 1500 having a input to accept the second time-differential signal on lines 904*a* and 904*b*, and an input to accept a first (e.g., MSB) bit of the residue control signal on line 528-($m$–1). The first MUX 1500 has an output on line 1502 to supply the leading edge and on line 906*b* a trailing edge of the second time-differential signal, responsive the residue control signal first bit value.

The programmable delay network 1200 comprises (m–x)/2 delay circuits having an input to accept the leading edge from the first MUX output on line 1502, and an output to supply (m–x)/2 leading edge delay signals, where x=2. The control network 1204 further comprises a second MUX 1504 having an input to accept the leading edge from the first MUX on line 1502 and leading edge delay signals. The second MUX 1504 has an input to accept [Ceil($\log_2$(m))–1] residue control signals bits on lines 528-1 and 528-2, and an output to supply an output leading edge signal selected in response to the bit values of the residue control signal. As a result, the control network 1204 signal output supplies an output time-differential signal with the selected output leading edge separated from the trailing edge from the first MUX by the second duration of time.

Figure 16:
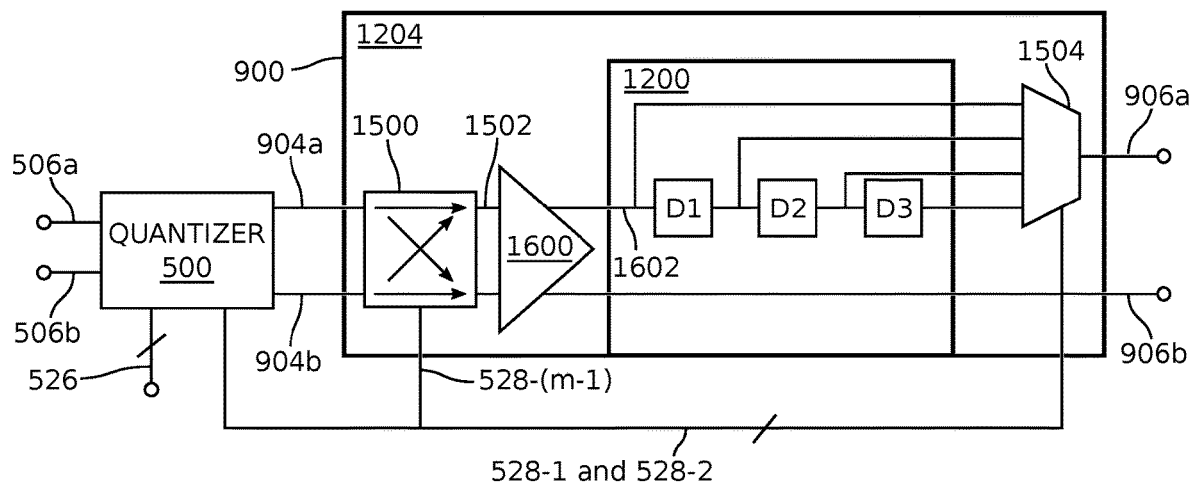
FIG. 16 is a schematic block diagram depicting the residue generator of FIG. 15 with a time amplifier.

FIG. 16 is a schematic block diagram depicting the residue generator of FIG. 15 with a time amplifier. The time amplifier 1600 has an input to accept the trailing edge on line 906b from the first MUX 1500 and an input to accept the leading edge on line 1502 from the first MUX, prior to the programmable delay network. The time amplifier has an output to supply a time-amplified leading edge on line 1602, separated from the trailing edge by a time-amplified duration of time, directly proportion to the first duration of time.

Figure 17A:
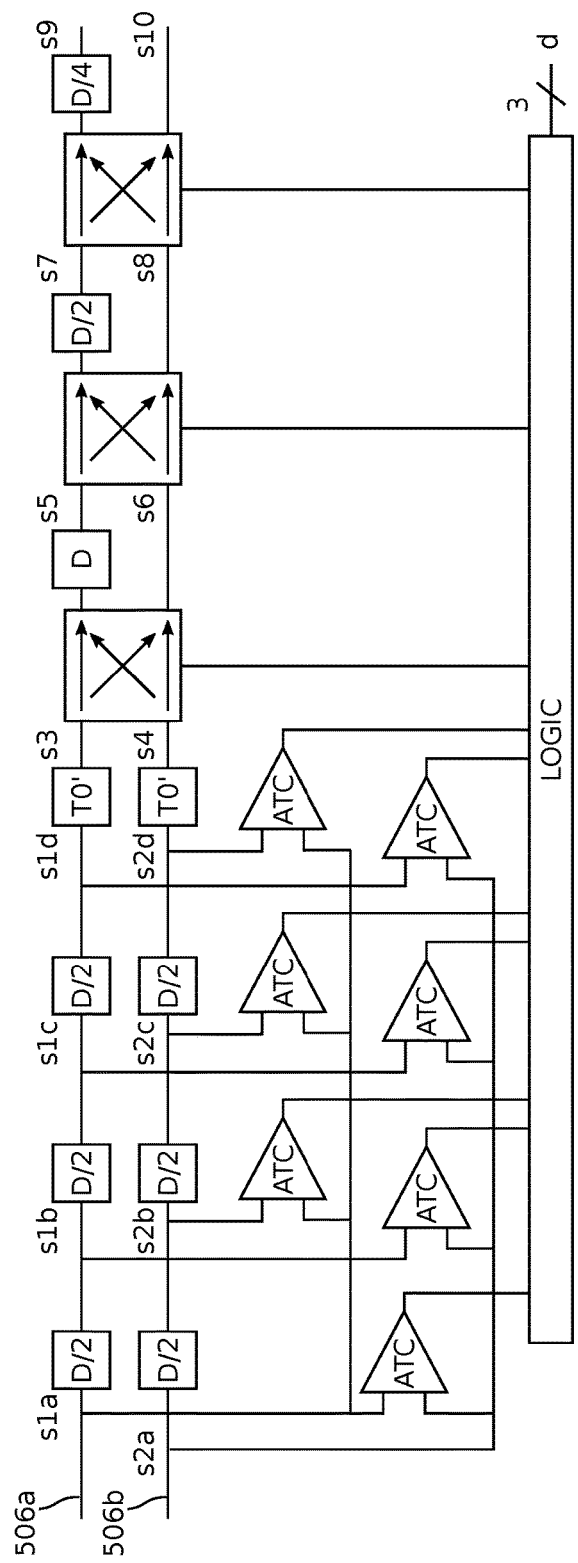
FIGS. 17A and 17B are, respectively, a TDC using the quantizer of FIG. 7 with a 3-stage sort-and-delay residue generator, and an associated timing diagram.
Figure 17B:
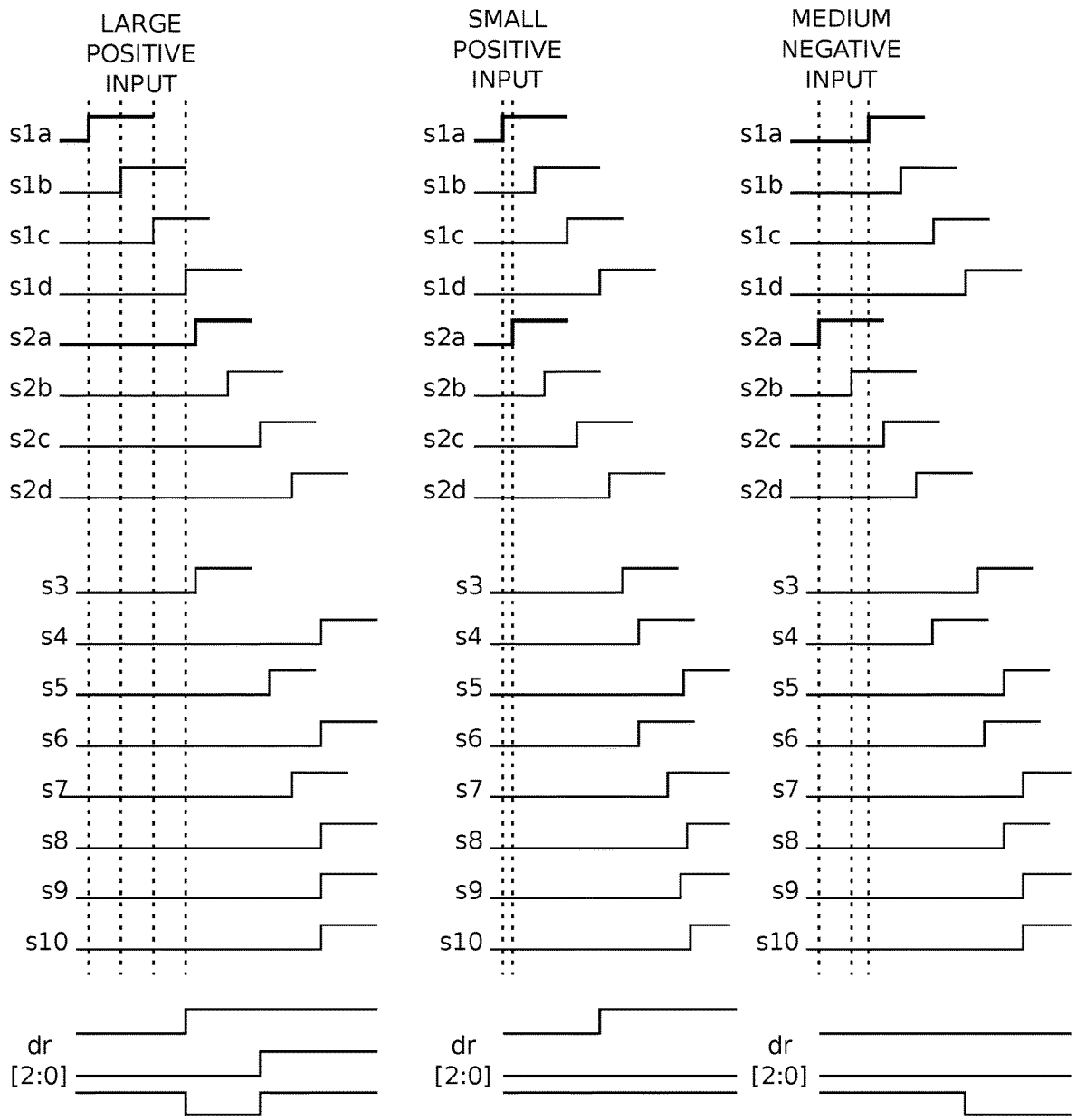
Figure 18:
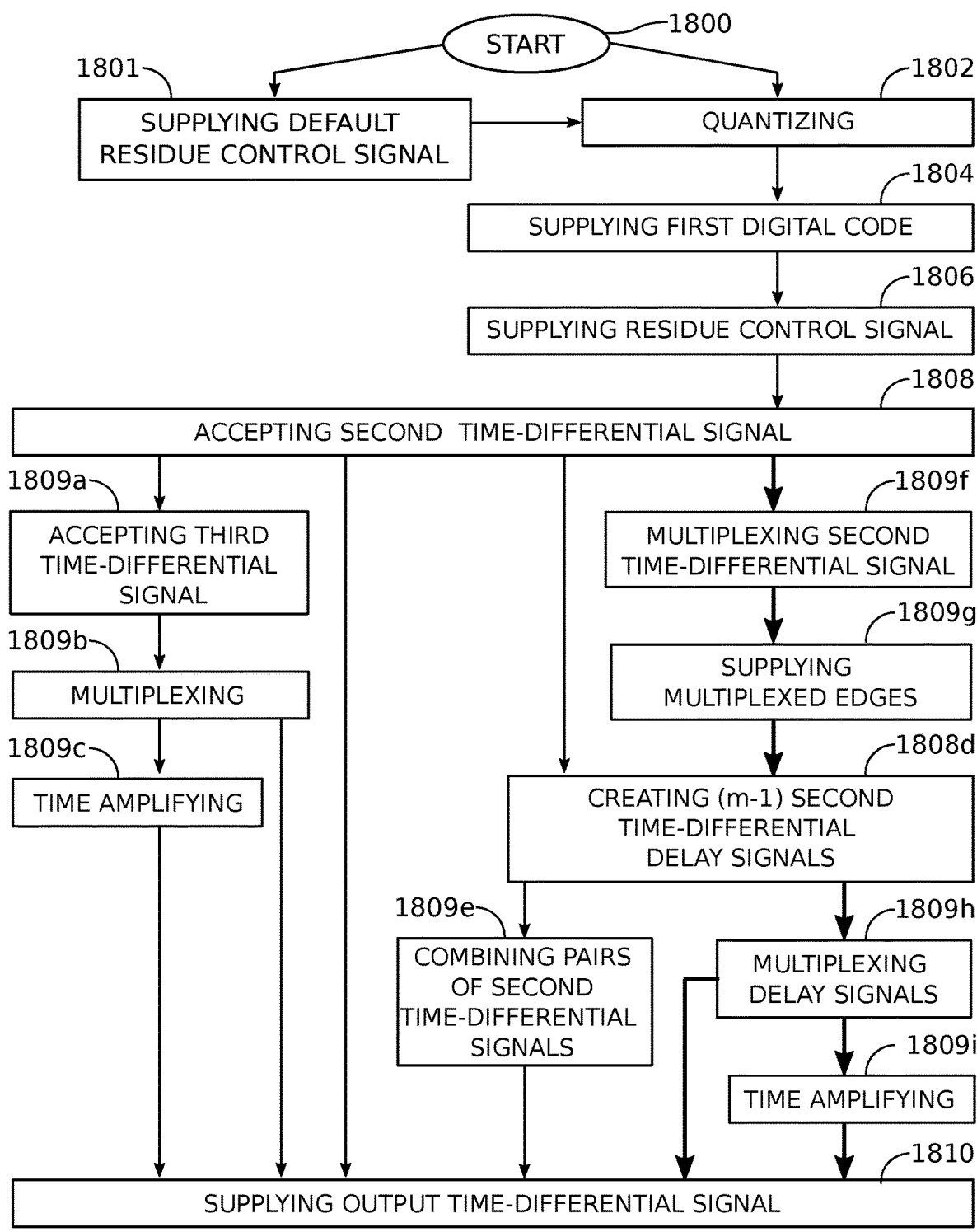
FIG. 18 is a flowchart illustrating a multi-symbol per stage pipelined TDC method.

FIGS. 17A and 17B are, respectively, a TDC using the quantizer of FIG. 7 with a 3-stage sort-and-delay residue generator, and an associated timing diagram. The "positive" input referred to in the timing diagram refers to the pulse on line 506a leading the pulse on line 506b. FIG. 18 is a flowchart illustrating a multi-symbol per stage pipelined TDC method. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1800.

Step 1802 quantizes an analog input first time-differential signal comprising a binary level first edge separated from a binary level second edge by a first duration of time, capable as being represented by m time intervals. Step 1804 supplies a first digital code representing $Ceil(log_2(m))$ bit values responsive to (m−1) time interval measurements of the first time-differential signal. Step 1806 supplies a second digital code residue control signal representing the $Ceil(log_2(m))$ bit values. Step 1808 accepts a second time-differential signal comprising a binary level first edge separated from a binary level second edge by the first duration of time. In response to the residue control signal, Step 1810 supplies an output time-differential signal having a first edge separated from a second edge by a second duration of time, where the difference between the first and second durations of time is responsive to the $Ceil(log_2(m))$ bit values.

In one aspect, prior to accepting the input time-differential signal in Step 1802, Step 1801 supplies a default residue control signal representing the minimum $[Ceil(log_2(m))-1]$ bit values. If Step 1802 accepts an input time-differential signal capable of being represented as a p-bit binary coded digital word, then Step 1806 may supply a first digital code representing the $Ceil(log_2(m))$ most significant bit (MSB) values of the p-bit digital word. However, the first and second digital codes need not necessarily be binary codes.

In one aspect, supplying the residue control signal in Step 1806 includes supplying a first residue control signal bit. Then, Step 1810 supplies a first output time differential signal with a leading edge, selected in response to the first residue control signal bit value, delayed a first time interval D1. In another aspect (see FIG. 11), prior to delaying the output time-differential signal by the first delay D1 in Step 1810, Step 1809a accepts a first edge of a third time-differential signal and a second edge of the third time-differential signal, where the third time-differential signal is delayed with respect to the second time-differential signal. Step 1809b multiplexes the first and second edges of the third time-differential signal and Step 1810 then supplies the leading edge and the trailing edge of the first output time-differential signal selected in response to the first residue control signal bit value. In addition, prior to delaying the leading edge of the output time-differential signal by the first time interval D1, Step 1809c time amplifies the leading edge, and supplying the output time-differential signal in Step 1810 includes supplying a time-amplified leading edge, separated from the trailing edge by a time-amplified duration of time, directly proportion to the first duration of time.

Alternatively, see FIG. 13, Step 1809d creates (m−1) second time-differential delay signals. In response to the residue control signal, Step 1809e combines a pair of second time-differential delay signals, and supplying the output time-differential signal in Step 1810 includes supplying the combined pair of second time-differential delay signals. In one aspect, Step 1809d includes substeps. Step 1809d first creates (m−x)/2 second time-differential first edge delays, typically serially connected, where x=2 when m is an even integer and x=1 when m is an odd integer. Then, Step 1809d creates (m−x)/2 second time-differential second edge delays that are typically serially connected. Then, supplying the output time-differential signal in Step 1810 includes substeps. Step 1810 first multiplexes the first edge delays in response to the residue control signal to supply one edge of the output differential signal. Step 1810 then multiplexes the second edge delays in response to the residue control signal to supply another edge of the output time-differential signal.

As another alternative, see FIG. 15, prior to creating (m−1) the second time-differential delay signals in Step 1809d, Step 1809f multiplexes the second time-differential signal in response to a first bit of the residue control signal. Step 1809g supplies a first multiplexed leading edge and a first multiplexed trailing edge of the second time-differential signal. Then, creating (m−1) the second time-differential delay signals in Step 1809d includes creating (m−x)/2 delays of the first multiplexed leading edge, where x=2. Step 1809h multiplexes the multiplexed leading edge and the (m−x)/2 delays in response to $[Ceil(log_2(m))-1]$ residue control signals bits to supply an output leading edge signal. Step 1810 supplies the output leading edge separated from the first multiplexed trailing edge by the second duration of time. In addition, Step 1809i may time amplify the first multiplexed leading edge, so that Step 1810 supplies a time-amplified leading edge, separated from the trailing edge by a time-amplified duration of time, directly proportion to the first duration of time.

Figure 19:
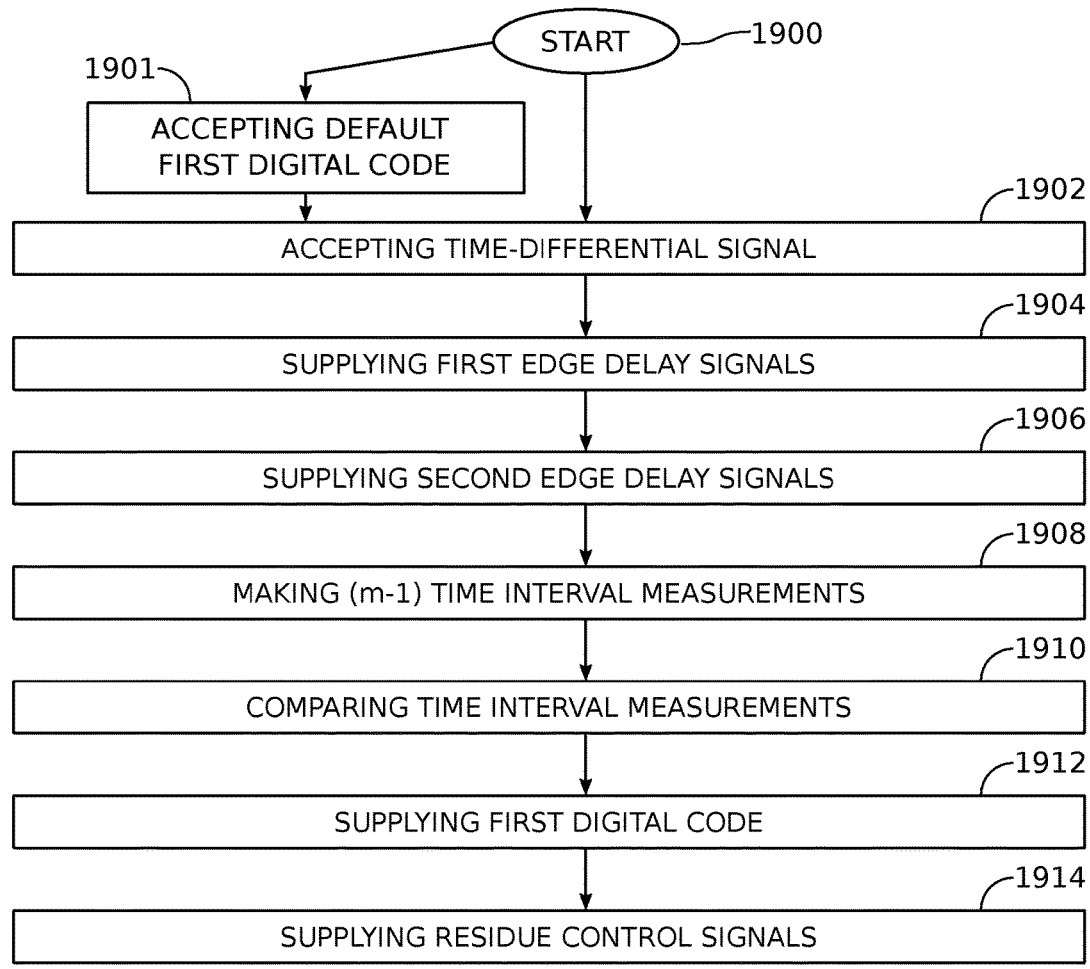
FIG. 19 is a flowchart illustrating a TDC multi-symbol quantization method.

FIG. 19 is a flowchart illustrating a TDC multi-symbol quantization method. The method starts at Step 1900. Step 1902 accepts an analog input time-differential signal comprising a binary level first edge separated from a binary level second edge by a duration of time, capable of being represented as m time intervals. Step 1904 supplies first edge signals with (m−x)/2 delays, where x=2 when m is an even integer and x=1 when m is an odd integer. Step 1906 supplies second edge signals with (m−x)/2 delays. Step 1908 makes (m−1) number of time interval measurements between the first edge signals and the second edge signals. Step 1910 compares the time interval measurements. Step 1912 supplies a first digital code representing $Ceil(log_2(m))$ bit values responsive to the time interval measurements. Step 1914 supplies a second digital code residue control signal representing the $Ceil(log_2(m))$ bit values.

If Step 1902 accepts an input time-differential signal capable of being represented as a p-bit binary coded digital word, then Step 1912 may supply a first digital code representing the $Ceil(log_2(m))$ most significant bit (MSB) values of the p-bit binary coded digital word. In one aspect, prior to making the time interval measurements, Step 1901 supplies a default first digital code equal to the minimum value of the $[Ceil(log_2(m))-1]$ bits.

Figure 20:
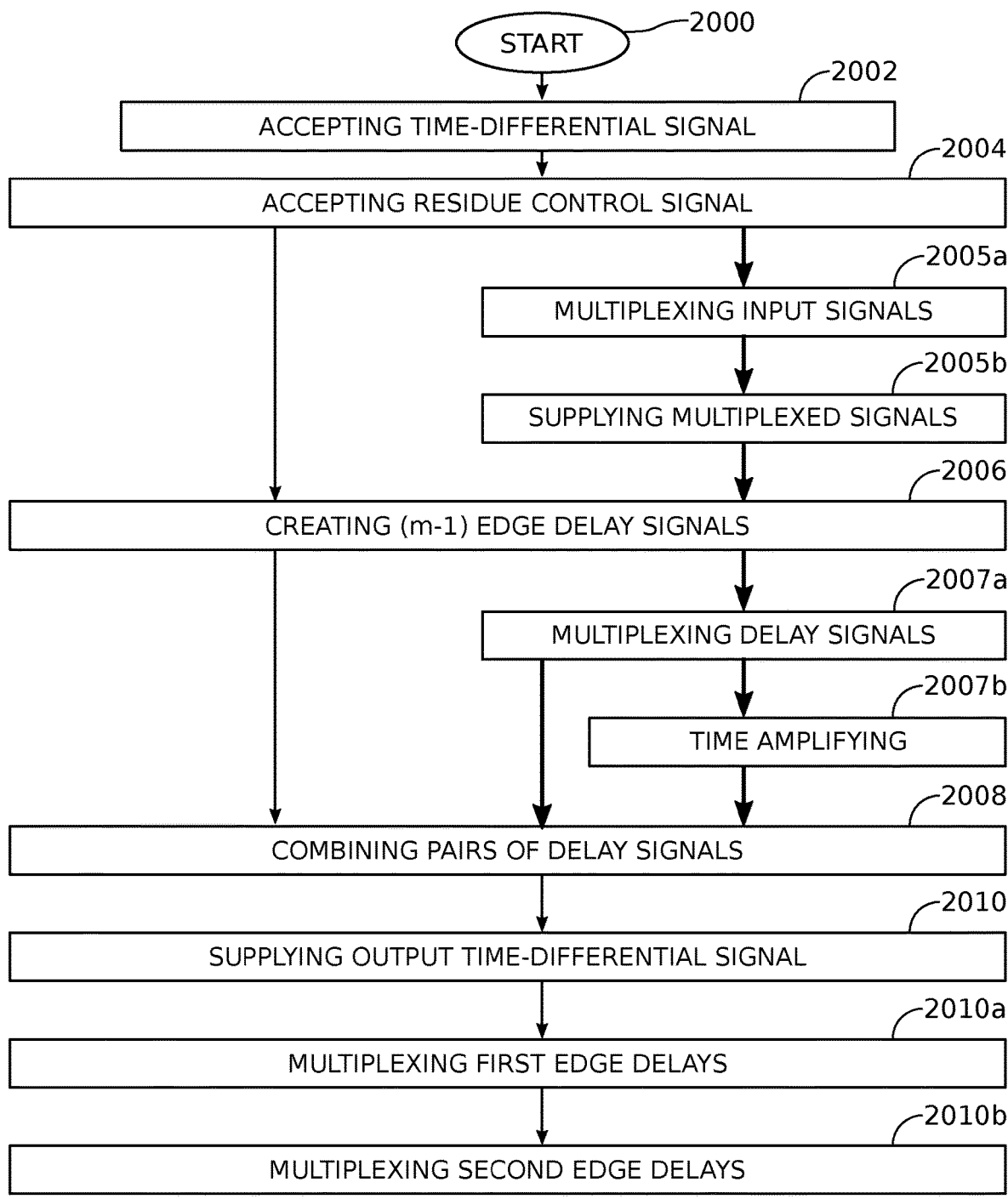
FIG. 20 is a flowchart illustrating a method for time-to-digital residue generation.

FIG. 20 is a flowchart illustrating a method for time-to-digital residue generation. The method begins at Step 2000. Step 2002 accepts an analog input time-differential signal comprising a binary level first edge separated from a binary level second edge by a first duration of time, capable as being represented by m time intervals, see FIG. 13. Step 2004 accepts Ceil(log$_2$(m)) residue control signal bit values. Step 2006 creates (m−1) first time-differential delay signals. In response to a residue control signal, Step 2008 combines a pair of the first time-differential delay signals, and Step 2010 supplies an output time-differential signal comprising the combined pair of first time-differential delay signals.

In one aspect, creating (m−1) first time-differential delay signals in Step 2006 includes substeps. Step 2006a creates (m−x)/2 first time-differential first edge delays, typically serially connected, where x=2 when m is an even integer and x=1 when m is an odd integer. Step 2006b creates (m−x)/2 first time-differential second edge delays that are typically serially connected. Then, supplying the output time-differential signal in Step 2010 includes substeps. Step 2010a multiplexes the first edge delays in response to the residue control signal to supply one edge of the output differential signal. Step 2010b multiplexes the second edge delays in response to the residue control signal to supply another edge of the output time-differential signal.

Alternatively, prior to creating (m−1) the first time-differential delay signals in Step 2006, Step 2005a multiplexes the first time-differential signal in response to a first bit of the residue control signal, see FIG. 15. Step 2005b supplies a first multiplexed leading edge and a first multiplexed trailing edge of the first time-differential signal. Then, creating (m−1) the first time-differential delay signals in Step 2006 includes creating (m−x)/2 delays of the first multiplexed leading edge, where x=2. Step 2007a multiplexes the multiplexed leading edge and the (m−x)/2 delays in response to [Ceil(log$_2$(m))−1] residue control signals bits to supply an output leading edge signal. Step 2010 supplies the output leading edge separated from the first multiplexed trailing edge by the second duration of time.

In one aspect, Step 2007b may time amplify the first multiplexed trailing edge, so that Step 2010 supplies a time-amplified leading edge, separated from the trailing edge by a time-amplified duration of time, directly proportion to the first duration of time.

TDC systems and methods have been provided. Examples of particular combinational logic, delay, routing, and decision structures have been presented to illustrate the invention. However, the invention is not limited to merely these examples. Other variations and embodiments of the invention will occur to those skilled in the art.

I claim:

1. A time-to-digital converter (TDC) multi-symbol quantizer, the quantizer comprising:
    a delay generator comprising:
        a signal input to accept an analog input time-differential signal comprising a binary level first edge separated from a binary level second edge by a duration of time, and capable of being represented as m time intervals;
        a first set of (m−x)/2 serially connected delay circuits having an input to accept the first edge and an output to supply first edge signals with (m−x)/2 delays, where x=2 when m is an even integer and x=1 when m is an odd integer;
        a second set of (m−x)/2 serially connected delay circuits having an input to accept the second edge and an output to supply second edge signals with (m−x)/2 delays;
    a detector comprising:
        a comparator network to accept the first edge signals and second edge signals, and make (m−1) number of time interval measurements between the first edge signals and the second edge signals;
        an output to supply prediction signals representing the time interval measurements from the comparator network;
    a logic circuit comprising:
        a calculator having an input to accept the prediction signals;
        a digital output to supply a first digital code representing Ceil(log$_2$(m)) bit values responsive to the time interval measurements; and,
        a digital output to supply a second digital code residue control signal representing the Ceil(log$_2$(m)) bit values.

2. The quantizer of claim 1 wherein the input time-differential signal is capable of being represented as a p-bit binary coded digital word; and,
    wherein the first digital code represents the Ceil(log$_2$(m)) most significant bit (MSB) values of the p-bit binary coded digital word.

3. The quantizer of claim 1 wherein the logic circuit, prior to receiving the prediction signals, outputs a default second digital code equal to the minimum value of the [Ceil(log$_2$(m1))−1] bits.

4. The quantizer of claim 1 wherein the delay generator first set of delay circuits comprises a first delay element having an input to accept the first edge of the input time differential signal and an output to supply a first edge with a first delay D1;
    wherein the delay generator second set of delay circuits comprises a second delay element having an input to accept the second edge of the input time differential signal and an output to supply a second edge with the first delay D1;
    wherein the detector comprises:
        a first arrival time comparator (ATC) having a first input to accept the first edge of the input time-differential signal, a second input to accept the second edge of the input time-differential signal, and an output to supply a prediction signal responsive to the order in which the first and second edges are received;
        a second ATC having a first input to accept the second edge with the first delay D1, a second input to accept the first edge of the input time-differential signal, and an output to supply a prediction signal responsive to the order in which the first and second edges are received;
        a third ATC having a first input to accept the first edge with the first delay D1, a second input to accept the second edge of the input time-differential signal, and an output to supply a prediction signal responsive to the order in which the input signals are received.

5. The quantizer of claim 4 wherein the first, second, and third ATCs are reset subsequent to the logic circuit supplying the first and second digital codes.

6. The quantizer of claim 1 wherein the delay generator first set of delay circuits comprises:
- a first delay element having an input to accept the first edge of the input time differential signal and an output to supply a first edge with the first delay D1;
- a second delay element having an input to accept the first edge with the first delay D1 and an output to supply a first edge with a second delay D2;
- a third delay element having an input to accept the first edge with the second delay D2 and an output to supply a first edge with a third delay D3;

wherein the delay generator second set of delay elements comprises:
- a fourth delay element having an input to accept the second edge of the input time-differential signal and an output to supply a second edge with the first delay D1;
- a fifth delay element having an input to accept the second edge with the first delay D1 and an output to supply a second edge with the second delay D2;
- a sixth delay element having an input to accept the second edge with the second delay D2 and an output to supply a second edge with the third delay D3;

wherein the detector comprises:
- a first ATC having a first input to accept the first edge of the input time-differential signal, a second input to accept the second edge of the input time-differential signal, and an output to supply a prediction signal responsive to the order in which the input signals are received;
- a second ATC having a first input to accept the second edge with the first delay D1, a second input to accept the first edge of the input time-differential signal, and an output to supply a prediction signal responsive to the order in which the input signals are received;
- a third ATC having a first input to accept the first edge with the first delay D1, a second input to accept the second edge of the input time-differential signal, and an output to supply a prediction signal responsive to the order in which the input signals are received;
- a fourth ATC having a first input to accept the second edge with the second delay D2, a second input to accept the first edge of the time-differential signal, and an output to supply a prediction signal responsive to the order in which the input signals are received;
- a fifth ATC having a first input to accept the first edge with the second delay D2, a second input to accept the second edge of the input time-differential signal, and an output to supply a prediction signal responsive to the order in which the input signals are received;
- a sixth ATC having a first input to accept the second edge with the third delay D3, a second input to accept the first edge of the input time-differential signal, and an output to supply a prediction signal responsive to the order in which the input signals are received;
- a seventh ATC having a first input to accept the first edge with the third delay D3, a second input to accept the second edge of the input time-differential signal, and an output to supply a prediction signal responsive to the order in which the input signals are received.

7. The quantizer of claim 1 wherein the delay generator first set of delay circuits comprises:
- a first delay element having an input to accept the first edge of the input time differential signal and an output to supply a first edge with the first delay D1;
- a second delay element having an input to accept the first edge with the first delay D1 and an output to supply a first edge with a second delay D2;
- a third delay element having an input to accept the first edge with the second delay D2 and an output to supply a first edge with a third delay D3;

wherein the delay generator second set of delay circuits comprises:
- a fourth delay element having an input to accept the second edge of the input time differential signal and an output to supply a second edge with the first delay D1;
- a fifth delay element having an input to accept the second edge with the first delay D1 and an output to supply a second edge with the second delay D2;
- a sixth delay element having an input to accept the second edge with the second delay D2 and to supply a second edge with the third delay D3;

wherein the detector comprises:
- a first ATC having a first input to accept the second edge with the first delay D1, a second input to accept the first edge of the input time-differential signal, and an output to supply a prediction signal responsive to the order in which the input signals are received;
- a second ATC having a first input to accept the first edge with the first delay D1, a second input to accept the second edge of the input time-differential signal, and an output to supply a prediction signal responsive to the order in which the input signals are received;
- a third ATC having a first input to accept the second edge with the second delay D2, a second input to accept the first edge of the input time-differential signal, and an output to supply a prediction signal responsive to the order in which the input signals are received;
- a fourth ATC having a first input to accept the first edge with the second delay D2, a second input to accept the second edge of the time-differential signal, and an output to supply a prediction signal responsive to the order in which the input signals are received;
- a fifth ATC having a first input to accept the second edge with the third delay D3, a second input to accept the first edge of the input time-differential signal, and an output to supply a prediction signal responsive to the order in which the input signals are received;
- a sixth ATC having a first input to accept the first edge with the third delay D3, a second input to accept the second edge of the input time-differential signal, and an output to supply a prediction signal responsive to the order in which the input signals are received.

8. A multi-symbol per stage pipelined time-to-digital converter (TDC), the TDC comprising:
- a quantizer comprising:
  - an input to accept an analog input first time-differential signal comprising a binary level first edge separated from a binary level second edge by a first duration of time, and capable as being represented by m time intervals;
  - an output to supply a first digital code representing Ceil($\log_2(m)$) bit values responsive to (m−1) time interval measurements;
  - an output to supply a second digital code residue control signal representing the Ceil($\log_2(m)$) bit values;
- a residue generator comprising:
  - a signal input to accept a second time-differential signal comprising a binary level first edge separated from a binary level second edge by the first duration of time;
  - a control input to accept the residue control signal; and,
  - a signal output to supply an output time-differential signal having a first edge separated from a second edge by a second duration of time, where the difference between the first and second durations of time is responsive to the Ceil($\log_2(m)$) bit values.

9. The TDC of claim 8 wherein the quantizer, prior to accepting the first time-differential signal, outputs a default residue control signal representing the minimum [Ceil($\log_2(m)$)−1] bit values.

10. The TDC of claim 8 wherein first time-differential signal is capable of being represented as a p-bit binary coded digital word; and,
wherein the quantizer outputs a first digital code representing the Ceil($\log_2(m)$) most significant bit (MSB) values of the p-bit digital word.

11. The TDC of claim 8 wherein the residue generator comprises:
a first residue generator stage comprising:
a signal input to accept the second time-differential signal;
a control input to accept a first residue control signal bit;
a signal output to supply a first output time differential signal with a leading edge, selected in response to the first residue control signal bit value, delayed a first time interval D1.

12. The TDC of claim 11 wherein the residue generator further comprises:
a second residue generator stage comprising:
a signal input to accept the first output time-differential signal;
a control input to accept a second residue control signal bit; and,
a signal output to supply a second output time differential signal with a leading edge, selected in response to the second residue control signal bit value, delayed a second interval of time D2.

13. The TDC of claim 12 wherein the residue generator comprises:
an (m−1)th residue generator stage comprising:
a signal input to accept an (mth−2) output time-differential signal;
a control input to accept an (m−1)th residue control signal bit; and,
a signal output to supply an (m−1)th output time differential signal with a leading edge, selected in response to the (m−1)th residue control signal bit value, delayed an (m−1)th interval of time D(m−1).

14. The TDC of claim 11 the first residue generator stage comprises:
a first multiplexor (MUX) having a first signal input to accept a first edge of a third time-differential signal, a second signal input to accept a second edge of the third time-differential signal, where the third time-differential signal is delayed with respect to the second time-differential signal, the first MUX having a control input to accept the first residue control signal bit, and a signal output to supply a leading edge of the first output time-differential signal selected in response to the first residue control signal bit value;
a second MUX having a first signal input to accept the second edge of the third time-differential signal, a second signal input to accept the first edge of the third time-differential signal, a control input to accept the first residue control signal bit, and a signal output to supply a trailing edge of the first output time-differential signal selected in response to the first residue control signal bit value; and,
a delay element having an input connected to the output of the first multiplexor to accept the leading edge, and an output to supply to a leading edge delayed the first interval of time D1.

15. The TDC of claim 14 wherein the first residue generator stage further comprises:
a time amplifier having an input to accept the leading edge of the first output time-differential signal, prior to being delayed the duration of time D1, an input to accept a trailing edge of the first output time-differential signal, separated from the leading edge by the first duration of time, and an output to supply a time-amplified leading edge, separated from the trailing edge by a time-amplified duration of time, directly proportion to the first duration of time; and,
wherein the first residue generator stage delays the time-amplified leading edge by the first duration of time D1.

16. The TDC of claim 8 wherein the residue generator comprises:
a programmable delay network comprising:
the signal input to accept the second time-differential signal;
a delay signal output to supply (m−1) delay signals;
a control network comprising:
a control input to accept the residue control signal; and,
a signal output to supply the output time-differential signal.

17. The TDC of claim 16 wherein the programmable delay network comprises:
a first set of (m−x)/2 delay circuits having an input to accept the first edge of the second time-differential signal, where x=2 when m is an even integer and x=1 when m is an odd integer; and,
a second set of (m−x)/2 delay circuits having an input to accept the second edge of the second time-differential signal.

18. The TDC of claim 17 wherein the control network comprises:
a first multiplexor (MUX) having an input to accept the delay signals from the first set of delay circuits, and an input to accept the residue control signal;
a second MUX having an input to accept the delay signals from the second set of delay circuits, and an input to accept the residue control signal; and,
wherein the first and second MUXs each have a signal output to supply differing edges of the output time-differential signal.

19. The TDC of claim 17 wherein the residue generator comprises:
(m−x)/2 stages, each stage comprising:
a programmable delay network comprising:
a first set of delay circuits having an input to accept a first edge of a corresponding input time-differential signal and supply corresponding delay signals;
a second set of delay circuits having an input to accept a second edge of a corresponding input time-differential signal and supply corresponding delay signals;
a control network comprising:
a first MUX having an input to accept the corresponding delay signals from the first set of delay circuits, and an input to accept a corresponding residue control signal;
a second MUX having an input to accept the corresponding delay signals from the second set of delay circuits, and an input to accept the corresponding residue control signal; and, a signal output to supply a corresponding output time-differential signal with a leading edge separated from a trailing edge by a duration of time responsive to the corresponding residue control signal bit value.

20. The TDC of claim 16 wherein the control network comprises:

a first MUX having a input to accept the second time-differential signal, an input to accept a first bit of the residue control signal, and an output to supply the leading edge and a trailing edge of the second time-differential signal, responsive the residue control signal first bit value;

wherein the programmable delay network comprises:

(m−x)/2 delay circuits having an input to accept the leading edge from the first MUX output, and an output to supply (m−x)/2 leading edge delay signals, where x=2;

wherein the control network further comprises:

a second MUX having an input to accept the leading edge from the first MUX and leading edge delay signals, an input to accept [Ceil($\log_2$(m))−1] residue control signals bits, and an output to supply an output leading edge signal selected in response to the bit values of the residue control signal; and, wherein the control network signal output supplies an output time-differential signal with the selected output leading edge separated from the trailing edge from the first MUX by the second duration of time.

21. The TDC of claim 20 further comprising:

a time amplifier having an input to accept the trailing edge from the first MUX and an input to accept the leading edge from the first MUX, prior to the programmable delay network, and an output to supply a time-amplified leading edge, separated from the trailing edge by a time-amplified duration of time, directly proportion to the first duration of time.

22. The TDC of claim 8 further comprising:

a first delay (T01) element having an output to supply the first edge of the second delayed time-differential signal; and, a second delay element (T02) having an output to supply the second edge of the second delayed time-differential signal.

23. The TDC of claim 8 wherein the quantizer comprises:

a delay generator comprising:

a signal input to accept the first time-differential signal;

a first set of (m−x)/2 serially connected delay circuits having an input to accept the first edge and an output to supply first edge signals with (m−x)/2 delays, where x=2 when m is an even integer and x=1 when m is an odd integer;

a second set of (m−x)/2 serially connected delay circuits having an input to accept the second edge and an output to supply second edge signals with (m−x)/2 delays;

a detector comprising:

a comparator network to accepts the first edge signals and the second edge signals, and make (m−1) number of time interval measurements between the first edge signals and the second edge signals;

an output to supply prediction signals representing the time interval measurements from the comparator network;

a logic circuit comprising:

a calculator having an input to accept the prediction signals;

an output to supply the first digital code; and, an output to supply the second digital code residue control signal.

24. The time-to-digital converter (TDC) residue generator comprising:

a programmable delay network comprising:

the signal input to accept an analog input time-differential signal comprising a binary level first edge separated from a binary level second edge by a first duration of time, and capable as being represented by m time intervals;

a delay signal output to supply (m−1) delay signals;

a control network comprising:

a control input to accept a digital code residue control signal representing Ceil($\log_2$(m)) bit values; and, a signal output to supply an output time-differential signal with a leading edge separated from a trailing edge by a second duration of time, where the difference between the first duration of time and the second duration of time is responsive to the Ceil($\log_2$(m)) bit values.

25. The residue generator of claim 24 wherein the programmable delay network comprises:

a first set of (m−x)/2 delay circuits having an input to accept the first edge where x=2 when m is an even integer and x=1 when m is an odd integer; and, a second set of (m−x)/2 delay circuits having an input to accept the second edge.

26. The residue generator of claim 25 wherein the control network comprises:

a first multiplexor (MUX) having an input to accept signals from the first set of delay circuits, and an input to accept the residue control signal;

a second MUX having an input to accept signals from the second set of delay circuits, and an input to accept the digital code residue control signal; and, wherein the first and second MUXs each have a signal output to supply differing edges of the output time-differential signal.

27. The residue generator of claim 25 comprising:

(m−x)/2 stages, each stage comprising:

a programmable delay network comprising:

a first set of delay circuits having an input to accept a first edge of a corresponding input time-differential signal and supply corresponding delay signals;

a second set of delay circuits having an input to accept a second edge of a corresponding input time-differential signal and supply corresponding delay signals;

a control network comprising:

a first MUX having an input to accept the corresponding delay signals from the first set of delay circuits, and an input to accept a corresponding residue control signal;

a second MUX having an input to accept the corresponding delay signals from the second set of delay circuits, and an input to accept the corresponding residue control signal; and, a signal output to supply a corresponding output time-differential signal with a leading edge separated from a trailing edge by a duration of time responsive to the corresponding residue control signal bit value.

28. The residue generator of claim 24 wherein the control network comprises:
- a first MUX having a input to accept the input time-differential signal, an input to accept a first bit of the residue control signal, and an output to supply the leading edge and a trailing edge of the input time-differential signal, responsive the residue control signal bit value;
- wherein the programmable delay network comprises:
  - (m−x)/2 delay circuits having an input to accept the leading edge from the first MUX and an output to supply (m−x)/2 leading edge delay signals, where x=2;
- wherein the control network further comprises:
  - a second MUX having an input to accept the leading edge from the first MUX and leading edge delay signals, an input to accept [Ceil($\log_2$(m))−1] residue control signals bits, and an output to supply an output leading edge signal selected in response to the bit values of the residue control signal
  - wherein the control network signal output supplies an output time-differential signal with the selected output leading edge separated from the trailing edge from the first MUX by the second duration of time.

29. The residue generator of claim 28 further comprises:
- a time amplifier having an input to accept the trailing edge from the first MUX and an input to accept the leading edge from the first MUX, prior to the programmable delay network, and an output to supply a time-amplified leading edge, separated from the trailing edge by a time-amplified duration of time, directly proportion to the first duration of time.

30. A multi-symbol per stage pipelined time-to-digital converter (TDC) method, the method comprising:
- quantizing an analog input first time-differential signal comprising a binary level first edge separated from a binary level second edge by a first duration of time, and capable as being represented by m time intervals;
- supplying a first digital code representing Ceil($\log_2$(m)) bit values responsive to (m−1) time interval measurements of the first time-differential signal;
- supplying a second digital code residue control signal representing the Ceil($\log_2$(m)) bit values;
- accepting a second time-differential signal comprising a binary level first edge separated from a binary level second edge by the first duration of time; and,
- in response to the residue control signal, supplying an output time-differential signal having a first edge separated from a second edge by a second duration of time, where the difference between the first and second durations of time is responsive to the Ceil($\log_2$(m)) bit values.

* * * * *